(12) United States Patent
Oguma et al.

(10) Patent No.: US 10,718,817 B2
(45) Date of Patent: Jul. 21, 2020

(54) BATTERY STATE ESTIMATING APPARATUS

(71) Applicants: Yasumasa Oguma, Tokyo (JP); Tetsuya Osaka, Tokyo (JP); Shingo Tsuda, Tokyo (JP); Kazuaki Utsumi, Tokyo (JP); Tokihiko Yokoshima, Tokyo (JP); Daikichi Mukoyama, Tokyo (JP)

(72) Inventors: Yasumasa Oguma, Tokyo (JP); Tetsuya Osaka, Tokyo (JP); Shingo Tsuda, Tokyo (JP); Kazuaki Utsumi, Tokyo (JP); Tokihiko Yokoshima, Tokyo (JP); Daikichi Mukoyama, Tokyo (JP)

(73) Assignees: TOYOTA JIDOSHA KABUSHIKI KAISHA, Toyota (JP); WASEDA UNIVERSITY, Tokyo (JP)

( * ) Notice: Subject to any disclaimer, the term of this patent is extended or adjusted under 35 U.S.C. 154(b) by 254 days.

(21) Appl. No.: 15/819,663

(22) Filed: Nov. 21, 2017

(65) Prior Publication Data

US 2018/0156872 A1 Jun. 7, 2018

(30) Foreign Application Priority Data

Dec. 2, 2016 (JP) .................................. 2016-235137

(51) Int. Cl.
*G01R 31/36* (2020.01)
*G01R 31/389* (2019.01)
*G01R 31/392* (2019.01)

(52) U.S. Cl.
CPC ......... *G01R 31/389* (2019.01); *G01R 31/392* (2019.01); *G01R 31/3648* (2013.01)

(58) Field of Classification Search
CPC ................ G01R 31/389; G01R 31/392; G01R 31/3648; G01R 31/367; G01R 31/374;
(Continued)

(56) References Cited

U.S. PATENT DOCUMENTS 9,229,061 B2 1/2016 Hebiguchi
10,507,734 B2 * 12/2019 Oguma ................ G01R 31/389
(Continued)

FOREIGN PATENT DOCUMENTS

JP 2014-126532 A 7/2014
WO 2013/018641 A1 2/2013
(Continued)

*Primary Examiner* — John H Le
(74) *Attorney, Agent, or Firm* — Oliff PLC

(57) ABSTRACT

A battery state estimating apparatus is provided with: an acquirer configured to obtain a plurality of complex impedances of a battery at a plurality of different temperatures; a calculator configured to calculate a slope of a straight line connecting values of the obtained plurality of complex impedances at a first predetermined frequency on a complex plane having an axis that is a real component of the complex impedance and an axis that is an imaginary component of the complex impedance, as a slope of the complex impedance; a storage configured to store in advance a relation between the slope of the complex impedance and a battery state associated with the battery; and an estimator configured to estimate the battery state on the basis of the calculated slope of the complex impedance and the stored relation.

9 Claims, 22 Drawing Sheets

(58) Field of Classification Search
CPC .............. G01R 31/382; G01R 31/3842; G01R 31/387; B60L 11/1861; B60L 2240/549; B60L 58/10; B60L 58/12; B60L 58/16; H01M 2220/20; H02J 7/0021; Y02T 10/7005
USPC ..................... 702/63; 324/430; 320/128, 134
See application file for complete search history.

(56) References Cited

U.S. PATENT DOCUMENTS

| | | | |
|---|---|---|---|
| 2006/0028178 A1* | 2/2006 | Hobbs | B60L 3/0046 320/128 |
| 2012/0316815 A1* | 12/2012 | Morigaki | G01R 31/392 702/63 |
| 2013/0156072 A1 | 6/2013 | Hebiguchi | |
| 2014/0218042 A1* | 8/2014 | Koba | G01R 31/389 324/430 |
| 2014/0229130 A1 | 8/2014 | Koba et al. | |
| 2016/0195577 A1 | 7/2016 | Osaka et al. | |

FOREIGN PATENT DOCUMENTS

| | | |
|---|---|---|
| WO | 2013/114669 A1 | 8/2013 |
| WO | 2013/115038 A1 | 8/2013 |
| WO | 2015/005141 A1 | 1/2015 |

* cited by examiner

BATTERY STATE ESTIMATING APPARATUS

CROSS-REFERENCE TO RELATED APPLICATIONS

This application is based upon and claims the benefit of priority of the prior Japanese Patent Application No. 2016-235137, filed on Dec. 2, 2016, the entire contents of which are incorporated herein by reference.

BACKGROUND OF THE INVENTION

1. Field of the Invention

Embodiments of the present invention relate to a battery state estimating apparatus configured to estimate a state of a battery mounted on a vehicle or the like.

2. Description of the Related Art

For this type of apparatus, there is known an apparatus configured to estimate a charge amount, a degradation state, or the like of a battery by analyzing an impedance of the battery. For example, in International Publication No. WO2013/114669, there is proposed a technique/technology in which the charge amount of the battery is detected from a slope angle of a straight line connecting two or more complex impedances with different frequencies. Moreover, in International Publication No. WO2013/018641, there is proposed a technique/technology in which an internal impedance is measured by using signals with frequencies that are hardly followed by ions in a power storage apparatus, and in which an internal temperature of the power storage apparatus is calculated from measured values.

Furthermore, as a method of calculating the impedance of the battery, for example, Japanese Patent Application Laid Open No. 2014-126532 discloses a technique/technology in which Fourier transform is performed on a response signal to an inputted rectangular wave signal, and in which impedance characteristics of an electrochemical cell are calculated on the basis of calculated frequency characteristics.

The impedance of the battery is caused by charge transfer or the like, and thus has an extremely high temperature dependence. The state of the battery is therefore hardly estimated on the basis of the impedance even in a temperature change of e.g. 5 degrees C.

A temperature of the battery can be detected by using a temperature sensor or the like; however, the temperature detected by this type of sensor does not necessarily match an actual internal temperature of the battery. There is also a temperature variation in area or in space in the battery, and it is thus hard to detect a temperature that is to be associated with the impedance, with pinpoint accuracy. In the technique/technology disclosed in International Publication No. WO2013/018641, a frequency area that is hardly influenced by the temperature dependence is used to detect the internal temperature of the battery or the power storage apparatus. A high frequency area has resistance components, such as terminal resistance, electron resistance inside an electrode body, and electrolyte resistance. If the resistance components other than the electrolyte resistance, which exhibits the temperature dependence, are changed, then, measurement accuracy is extremely reduced.

In the technique/technology disclosed in International Publication No. WO2013/114669, the state of the battery is detected by using the impedance; however, the temperature of the battery is not considered. Thus, even at the same frequency, the detected value of the impedance may vary depending on the temperature of the battery, resulting in inaccurate detection of the state of the battery, which is technically problematic.

SUMMARY

In view of the aforementioned problems, it is therefore an object of embodiments of the present invention to provide a battery state estimating apparatus configured to accurately estimate a state of a battery by using impedance.

The above object of embodiments of the present invention can be achieved by a battery state estimating apparatus comprising: an acquirer configured to obtain a plurality of complex impedances of a battery at a plurality of different temperatures; a calculator configured to calculate a slope of a straight line connecting values of the obtained plurality of complex impedances at a first predetermined frequency on a complex plane having an axis that is a real component of the complex impedance and an axis that is an imaginary component of the complex impedance, as a slope of the complex impedance; a storage configured to store in advance a relation between (i) the slope of the complex impedance and (ii) a battery state associated with the battery; and an estimator configured to estimate the battery state on the basis of (i) the calculated slope of the complex impedance and (ii) the stored relation.

According to the battery state estimating apparatus in embodiments of the present invention, the slope of the complex impedance on the complex plane is calculated from the plurality of complex impedances obtained at the plurality of different temperatures. The use of the slope of the complex impedance can eliminate an influence of the temperature dependence of the complex impedance, resulting in accurate estimation of the battery state. The "battery state" herein is a quantitative or qualitative characteristic, which can be changed with time or which can vary depending on a time point, such as, for example, a state of charge (SOC) and a state of health (SOH). Here, in particular, the battery state is represented by data. Therefore, according to embodiments of the present invention, the battery state can be estimated without highly accurate temperature detection, temperature adjustment or similar actions in the estimation of the battery state.

In one aspect of the battery state estimating apparatus according to embodiments of the present invention, further comprising: a determinator configured to determine an intersection of a straight line connecting values of the obtained plurality of complex impedances at a second predetermined frequency and the axis that is the real component, to be a reference point; and a corrector configured to correct the calculated slope of the complex impedance, to a slope of a straight line connecting the reference point and the values of the obtained plurality of complex impedances at the first predetermined frequency.

According to this aspect, the intersection of the straight line indicating the slope of the complex impedance and the axis that is the real component is determined to be the referenced point, and the slope of the complex impedance is corrected on the basis of the straight line passing through the reference point. Therefore, according to this aspect, the influence of the temperature dependence of the complex impedance can be eliminated in the estimation of the battery state, and the battery state can be accurately estimated.

In another aspect of the battery state estimating apparatus according to embodiments of the present invention, the determinator is configured to calculate a plurality of intersections by changing the second predetermined frequency and is configured to determine a point corresponding to a convergence value on which a distribution of the calculated plurality of intersections converges, to be the reference point.

According to this aspect, the reference point is determined on the basis of the plurality of intersections calculated by changing the second predetermined frequency, and the slope of the complex impedance is corrected on the basis of the straight line passing through the reference point. The expression, "the distribution of the calculated plurality of intersections converges", means that the plurality of intersections approach or come together at a point on a real number axis in a predetermined frequency range, or that the plurality of intersections are located in an extremely narrow range on the real number axis. For example, a value obtained by averaging positions of the plurality of intersections that converge in this manner may be determined to be the reference point. By virtue of such a configuration, it is possible to determine the reference point that can more preferably eliminate the influence of the temperature dependence of the complex impedance.

In an aspect in which the slope of the complex impedance is corrected by using the reference point described above, the second predetermined frequency may be a frequency corresponding to a circular arc component of the complex impedance on the complex plane.

In plotting the complex impedance of the battery on the complex plane (i.e. Cole-Cole plot), a part of the plot draws a semicircle. Even when the frequency corresponding to the circular arm component is used as the second predetermined frequency, the reference point can be appropriately determined.

In another aspect of the battery state estimating apparatus according to embodiments of the present invention, the battery state includes a value indicating a charge amount of the battery.

According to this aspect, it is possible to estimate the value indicating the charge amount of the battery (e.g. SOC) without being influenced by temperature.

In an aspect in which the battery state includes the value indicating the charge amount of the battery described above, the battery state estimating apparatus may be further provided with: a charger configured to charge the battery; and a stopper configured to stop charging performed by the charger if the value indicating the charge amount of the battery is a value corresponding to full charge.

In this case, it is possible to appropriately determine the full charge of the battery (i.e. a state in which the battery is not to be charged anymore).

In another aspect of the battery state estimating apparatus according to embodiments of the present invention, the battery state includes a value indicating degree of degradation of the battery.

According to this aspect, it is possible to estimate the value indicating the degree of degradation of the battery (e.g. SOH) without being influenced by temperature.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENTS

A battery state estimating apparatus according to embodiments of the present invention will be explained with reference to the drawings.

First Embodiment

A battery state estimating apparatus 100 according to a first embodiment will be explained. The following is an example in which the battery state estimating apparatus 100 is configured to estimate a battery state associated with a battery of a vehicle.

(1) Configuration of Apparatus

Figure 1:
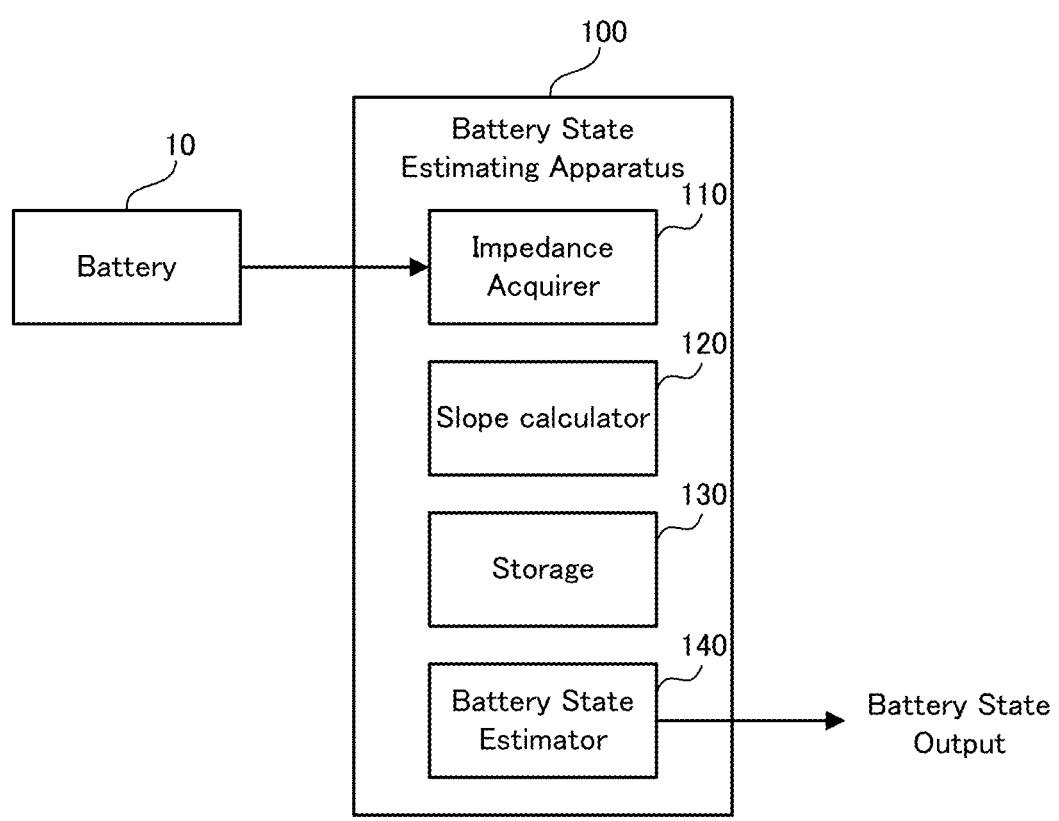
FIG. 1 is a block diagram illustrating a configuration of a battery state estimating apparatus according to a first embodiment.

Firstly, a configuration of the battery state estimating apparatus 100 according to the first embodiment will be explained with reference to FIG. 1. FIG. 1 is a block diagram illustrating the configuration of the battery state estimating apparatus 100 according to the first embodiment.

As illustrated in FIG. 1, the battery state estimating apparatus 100 according to the first embodiment is an electronic unit electrically connected to a battery 10 of a vehicle, and is configured to estimate a SOC, which is a battery state of the battery 10. The battery 10 is one specific example of the "battery", and is configured as a chargeable aqueous secondary battery, such as, for example, a lithium ion battery.

The battery state estimating apparatus 100 is provided with an impedance acquirer 110, a slope calculator 120, a storage 130, and a battery state estimator 140, as logical or physical processing blocks realized therein.

The impedance acquirer 110 is one specific example of the "acquirer" and is configured to obtain a complex impedance of the battery 10. The impedance acquirer 110 is configured to obtain the complex impedance, for example, by applying alternating current (AC) voltage to the battery 10 while changing frequency. A method of obtaining the complex impedance can use the exiting technique/technology, as occasion demands, and a detailed explanation herein will be thus omitted. The complex impedance of the battery 10 obtained by the impedance acquirer 110 is configured to be outputted to the slope calculator 120.

The slope calculator 120 is one specific example of the "calculator" and is configured to calculate a slope of the complex impedance of the battery 10. The slope calculator 120 is configured to plot a plurality of complex impedances obtained by the impedance acquirer 110 on a complex plane, to draw a straight line connecting values of the plurality of complex impedances corresponding to a first predetermined frequency, and to calculate a slope of the straight line as the slope of the complex impedance. The "first predetermined frequency" is set in advance to calculate the slope of the complex impedance, and is appropriately selected from a frequency range of the AC voltage that is applied to the battery 10 to obtain the complex impedance. The slope of the complex impedance calculated by the slope calculator 120 is configured to be outputted to the battery state estimator 140.

The storage 130 is one specific example of the "storage" and is configured to include e.g. a read only memory (ROM) or the like. The storage 130 is configured to store a relation between the slope of the complex impedance of the battery 10 derived from previous simulation results and the SOC. More specifically, for example, an operation of calculating the slope of the complex impedance when the SOC is known may be repeated while changing the SOC, and an association between the slope of the complex impedance and the SOC at that time may be stored in the storage 130. If the relation between the slope of the complex impedance and the SOC can be expressed by particular numerical equations, the storage 130 may store the numerical equations. Information stored in the storage 130 is configured to be outputted to the battery state estimator 140 as occasion demands.

The battery state estimator 140 is one specific example of the "estimator" and is configured to estimate the SOC from the slope of the complex impedance of the battery 10. The battery state estimator 140 is configured to estimate the SOC of the battery 10 on the basis of the slope of the complex impedances calculated by the slope calculator 120 and the relation between the slope of the complex impedance and the SOC, which is read from the storage 130. The battery state estimator 140 is configured to output an estimated value of the SOC of the battery 10.

(2) Explanation of Operation

Figure 2:
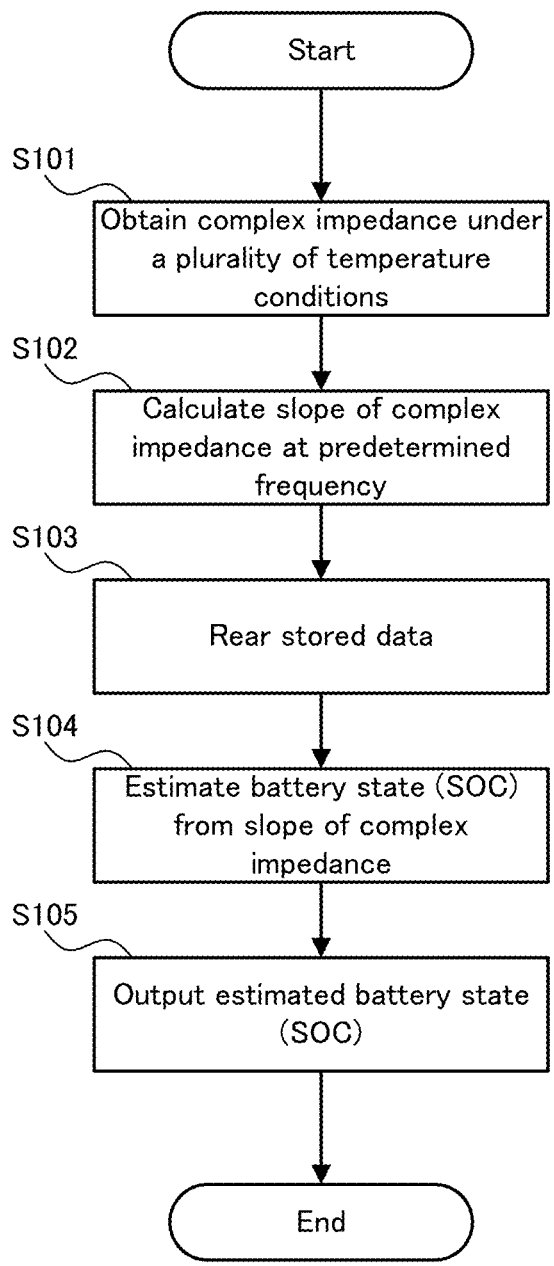
FIG. 2 is a flowchart illustrating a flow of operation of the battery state estimating apparatus according to the first embodiment.

Next, the operation of the battery state estimating apparatus 100 according to the first embodiment will be explained with reference to FIG. 2. FIG. 2 is a flowchart illustrating a flow of the operation of the battery state estimating apparatus 100 according to the first embodiment.

As illustrated in FIG. 2, in operation of the battery state estimating apparatus 100 according to the first embodiment, the impedance acquirer 110 firstly obtains the complex impedance of the battery 10 under a plurality of temperature conditions in which the battery 10 has different internal temperatures (step S101). In other words, the impedance acquirer 110 obtains a plurality of complex impedances corresponding to different temperatures. At this time, it is preferable to obtain the plurality of complex impedances in a condition in which the battery states to be estimated (or the SOC herein) can be regarded as being the same or almost the same. It is thus not preferable to take a long time to obtain the plurality of complex impedances. The temperature of the battery 10 significantly varies even in extremely low discharge or the like. Thus, the complex impedance can be obtained under the plurality of different temperature conditions, even in substantially the same SOC.

Figure 3:
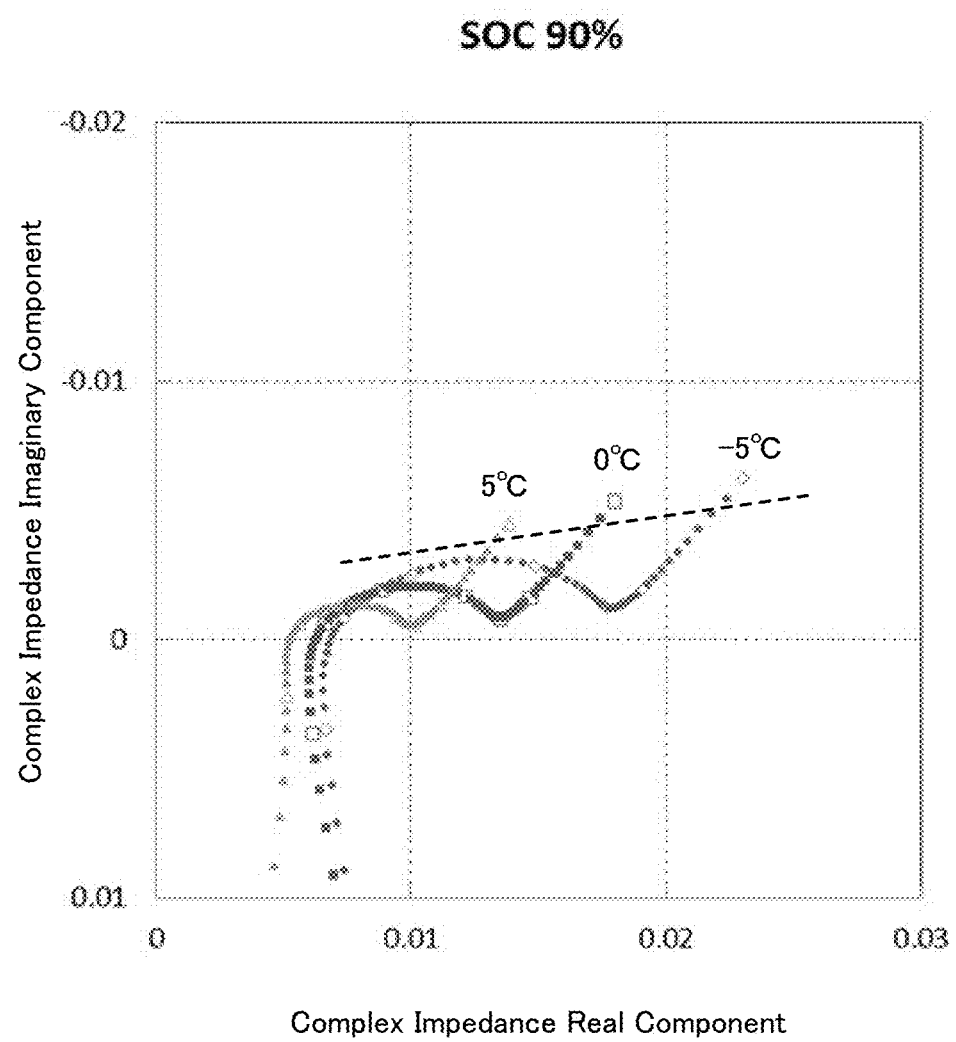
FIG. 3 is a graph illustrating one example of a slope of complex impedance in SOC 90%.
Figure 4:
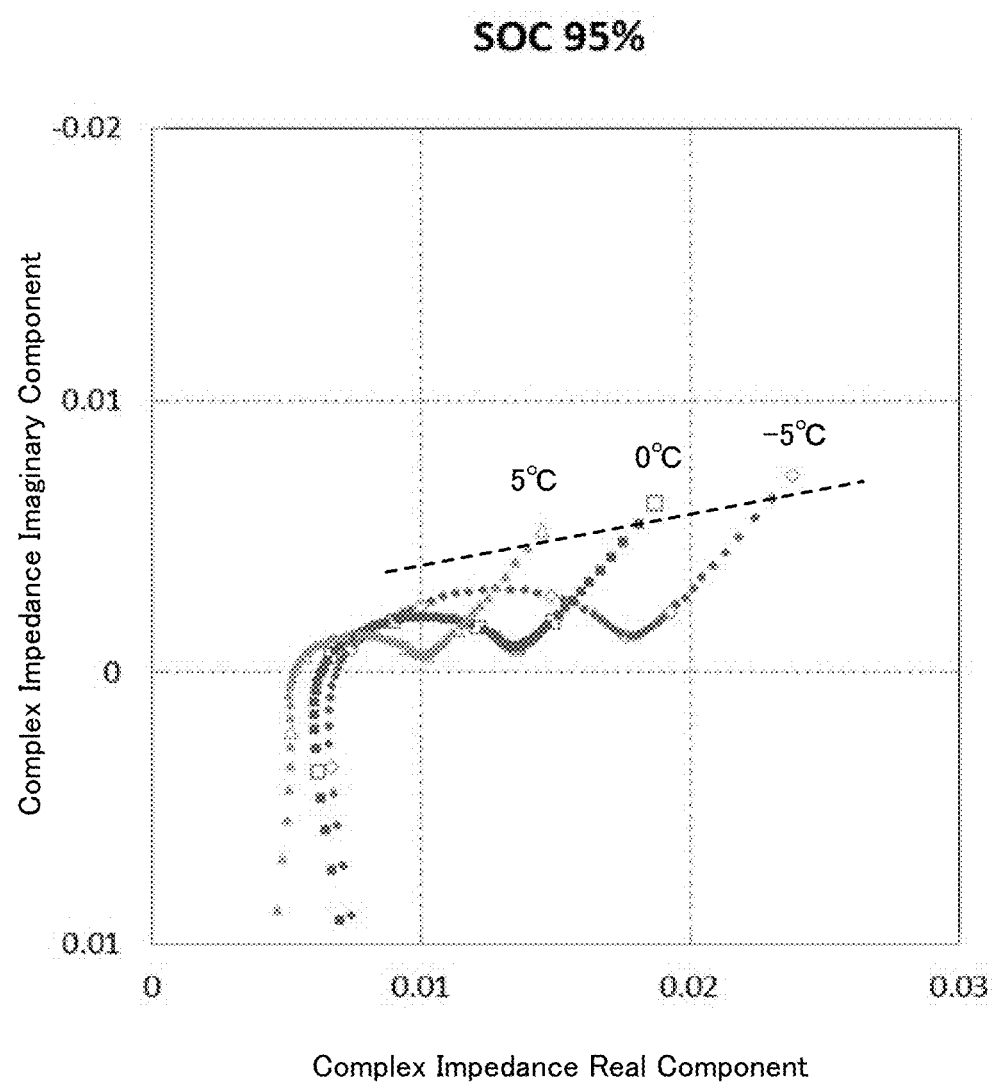
FIG. 4 is a graph illustrating one example of the slope of the complex impedance in SOC 95%.
Figure 5:
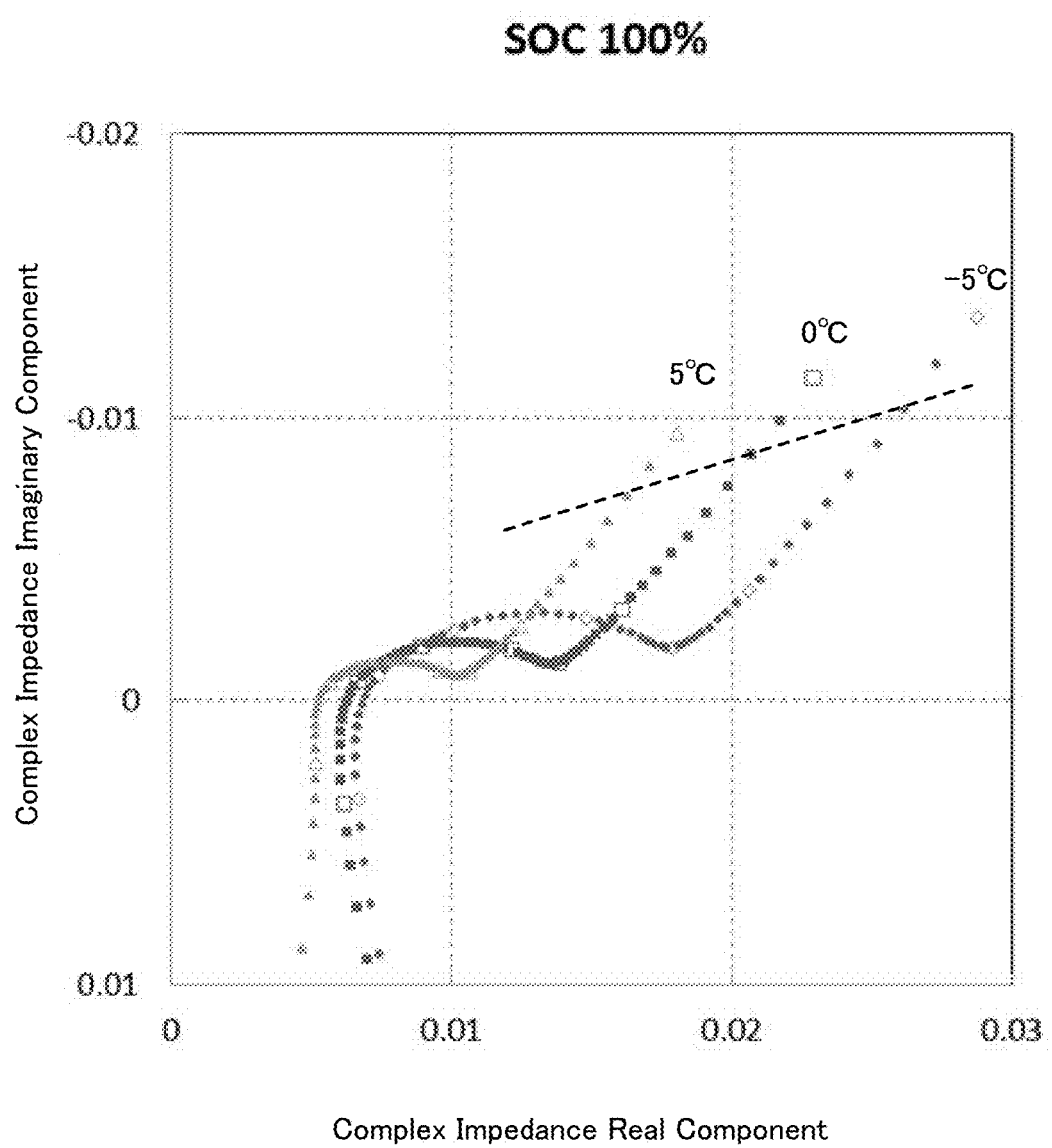
FIG. 5 is a graph illustrating one example of the slope of the complex impedance in SOC 100%.

After the acquisition of the complex impedances, the slope calculator 120 calculates the slope of the complex impedance from the obtained plurality of complex impedances (step S102). Hereafter, the slope of the complex impedance will be specifically explained with reference to FIG. 3 to FIG. 5. FIG. 3 is a graph illustrating one example of the slope of the complex impedance in SOC 90%. FIG. 4 is a graph illustrating one example of the slope of the complex impedance in SOC 95%. FIG. 5 is a graph illustrating one example of the slope of the complex impedance in SOC 100%.

For convenience of explanation, FIG. 3 to FIG. 5 illustrate the complex impedances obtained in a condition in which the SOC of the battery 10 is accurately known. Moreover, the temperature of the battery 10 in the acquisition of the complex impedance is accurately known to be 5 degrees C., 0 degrees C., and −5 degrees C. In the calculation of the slope of the complex impedance, however, it is not necessarily required to know the accurate temperature of the battery 10. In other words, as long as the complex impedances are obtained at different temperatures, specific temperature values could be unknown.

As illustrated in FIG. 3, in the case of the SOC of the battery 10 of 90%, when complex impedances obtained at temperatures of the battery 10 of 5 degrees C., 0 degrees C., and −5 degrees C. are plotted on a complex plane, the complex impedances are drawn as different curves that are shifted to the right side with decreasing temperature. A straight line connecting values of the complex impedances corresponding to the first predetermined frequency (or 15.8 mHz herein) (which is specifically an approximate straight line derived from the values) has a slope of "−0.163". The slope of the complex impedance in this case is thus calculated as "−0.163".

As illustrated in FIG. 4, in the case of the SOC of the battery 10 of 95%, when complex impedances obtained at temperatures of the battery 10 of 5 degrees C., 0 degrees C., and −5 degrees C. are plotted on a complex plane to draw a straight line connecting values of the complex impedances corresponding to the first predetermined frequency (i.e. 15.8 mHz), the straight line has a slope of "−0.187". The slope of the complex impedance in this case is thus calculated as "−0.187".

As illustrated in FIG. 5, in the case of the SOC of the battery 10 of 100%, when complex impedances obtained at temperatures of the battery 10 of 5 degrees C., 0 degrees C., and −5 degrees C. are plotted on a complex plane to draw a straight line connecting values of the complex impedances corresponding to the first predetermined frequency (i.e. 15.8 mHz), the straight line has a slope of "−0.312". The slope of the complex impedance in this case is thus calculated as "−0.312".

The slope of the complex impedance herein is calculated as a value corresponding to a ratio of a variation between an imaginary component and a real component of the complex impedance; however, an angle of the straight line may be calculated as the slope of the complex impedance.

Back in FIG. 2, after the calculation of the slope of the complex impedance, the battery state estimator 140 reads the relation between the slope of the complex impedance and the SOC, which is stored in advance, from the storage 130 (step S103), and estimates the current SOC of the battery 10 from the calculated slope of the complex impedance (step S104).

Figure 6:
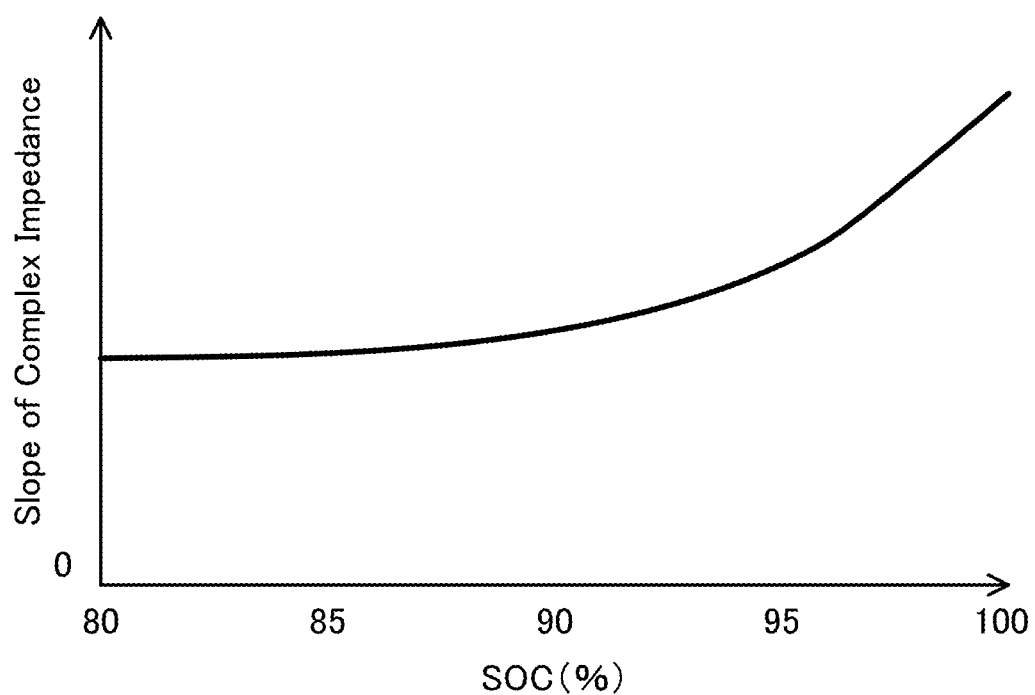
FIG. 6 is a map illustrating a relation between the slope of the complex impedance and SOC.

Hereinafter, a method of estimating the SOC from the slope of the complex impedance will be explained in detail with reference to FIG. 6. FIG. 6 is a map illustrating the relation between the slope of the complex impedance and the SOC.

As illustrated in FIG. 6, according to studies by the present inventors, it has been found that the slope of the complex impedance has a larger absolute value with increasing SOC of the battery 10. The relation is apparent from the results in FIG. 3 to FIG. 5 as well. In accordance with the increase in the SOC of 90%, 95%, and 100%, the slope of the complex impedance is respectively "−0.163", "−0.187", "−0.312", and the absolute value thereof gradually increases.

As a result, if the slope of the complex impedance can be calculated by using the complex impedances obtained at different temperatures, the SOC of the battery 10 can be estimated from the value of the slope. Specifically, if the storage 130 stores the map illustrated in FIG. 6, it is possible to derive the value of the SOC corresponding to the calculated slope of the complex impedance.

Moreover, the complex impedance itself is a value having a temperature dependence. In the embodiment, however, the relation between the slope of the complex impedance and the SOC has little temperature dependence, because the slope of the complex impedance is calculated as explained in FIG. 3 to FIG. 5. In other words, even if the temperature of the battery 10 is changed, there is little change in the relation illustrated in FIG. 6. It is therefore possible to accurately estimate the SOC of the battery 10, even when there is a variation in temperature in each part of the battery 10 and the temperature is hardly detected.

Back in FIG. 2 again, the battery state estimator 140 outputs the estimated value of the SOC of the battery 10 (step S105). For example, the outputted value of the SOC is displayed on a display that can be visually recognized by an occupant of the vehicle or is used for vehicle travel control. The above is an entire process of estimating the SOC of the battery 10. For example, the process may be started again from the step S101 after a lapse of a predetermined period.

As explained above, according to the battery state estimating apparatus 100 in the first embodiment, it is possible to estimate the SOC of the battery 10 while eliminating an influence of the temperature dependence, by using the complex impedance obtained from the battery 10.

Second Embodiment

A battery state estimating apparatus 200 according to a second embodiment will be explained. The second embodiment is partially different from the first embodiment in configuration and operation, and the other part is substantially the same. Thus, hereinafter, a different part from that of the first embodiment explained above will be explained in detail, and an explanation of the same part will be omitted.

(1) Configuration of Apparatus

Figure 7:
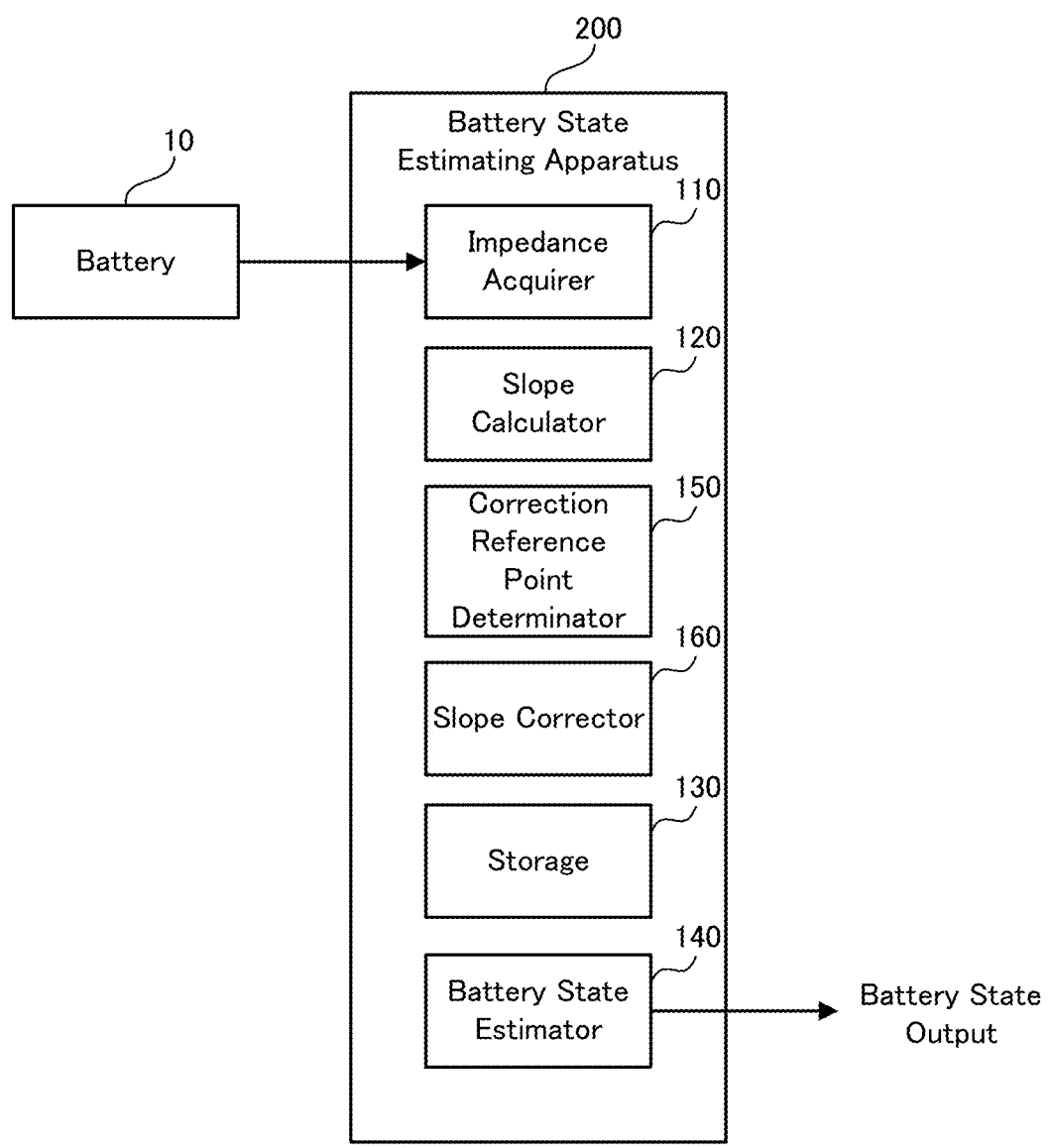
FIG. 7 is a block diagram illustrating a configuration of a battery state estimating apparatus according to a second embodiment.

Firstly, a configuration of the battery state estimating apparatus 200 according to the second embodiment will be explained with reference to FIG. 7. FIG. 7 is a block diagram illustrating the configuration of the battery state estimating apparatus 200 according to the second embodiment. FIG. 7 carries the same reference numerals as those for the same constituent elements illustrated in FIG. 1.

As illustrated in FIG. 7, the battery state estimating apparatus 200 according to the second embodiment is provided with a correction reference point determinator 150 and a slope corrector 160, in addition to the constituent elements of the battery state estimating apparatus 100 according to the first embodiment (refer to FIG. 1).

The correction reference point determinator 150 is one specific example of the "determinator" and is configured to determine a correction reference point for correcting the slope of the complex impedance. The correction reference point is one specific example of the "reference point". A method of determining the correction reference point will be detailed later in Explanation of Operation. Information regarding the correction reference point determined by the correction reference point determinator 150 is configured to be outputted to the slope corrector 160.

The slope corrector 160 is one specific example of the "corrector" and is configured to correct the slope of the complex impedance calculated by the slope corrector 120 on the basis of the correction reference point determined by the correction reference point determinator 150. A method of correcting the slope of the complex impedance will be detailed later in Explanation of Operation. The slope of the complex impedance corrected by the slope corrector 160 is configured to be outputted to the battery state estimator 140. The battery state estimator 140 according to the second embodiment is thus configured to estimate the battery state (i.e. SOC) of the battery 10 by using not the slope of the complex impedance calculated by the slope corrector 120 but the slope of the complex impedance corrected by the slope corrector 160.

(2) Explanation of Operation

Figure 8:
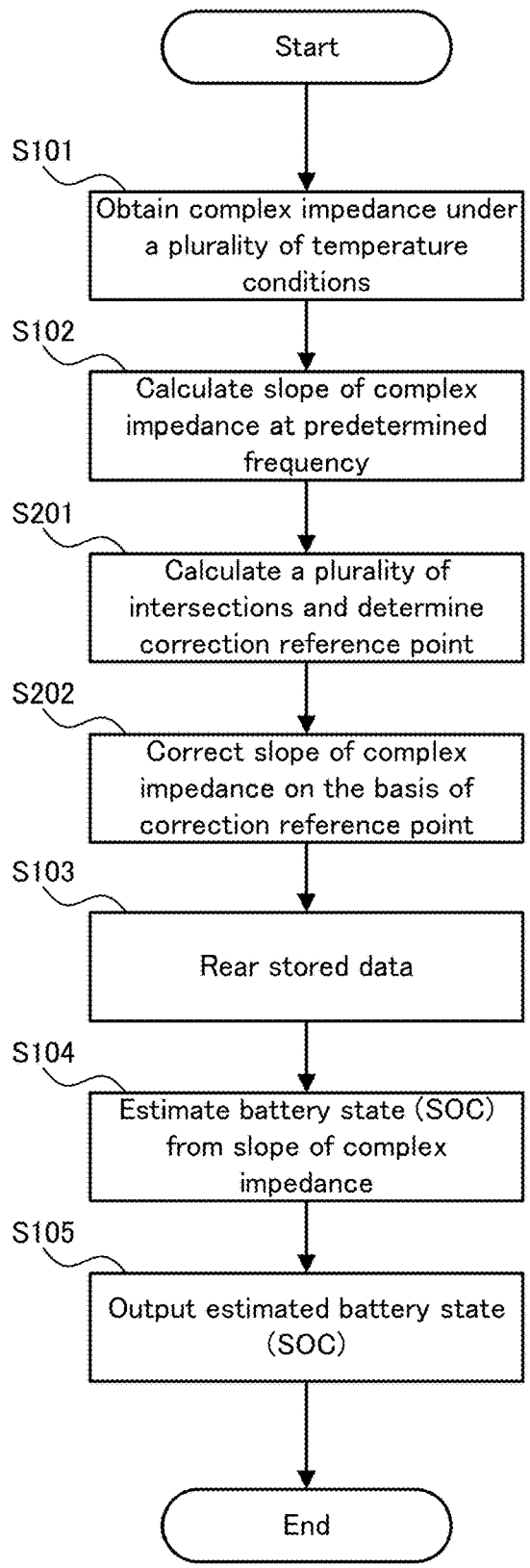
FIG. 8 is a flowchart illustrating a flow of operation of the battery state estimating apparatus according to the second embodiment.

Next, operation of the battery state estimating apparatus 200 according to the second embodiment will be explained with reference to FIG. 8. FIG. 8 is a flowchart illustrating a flow of the operation of the battery state estimating apparatus 200 according to the second embodiment. FIG. 8 carries the same reference numerals as those for the same steps illustrated in FIG. 2.

As illustrated in FIG. 8, in operation of the battery state estimating apparatus 200 according to the second embodiment, the impedance acquirer 110 firstly obtains the complex impedance of the battery 10 under the plurality of different temperature conditions (the step S101). The slope calculator 120 calculates the slope of the complex impedance from the obtained plurality of complex impedances (the step S102). In other words, so far, the same process as in the first embodiment is performed.

In the second embodiment, the correction reference point determinator 150 then calculates a plurality of intersections of straight lines (which are specifically approximate straight lines), each of which connects values of a plurality of complex impedances corresponding to a second predetermined frequency, and an X axis (i.e. a real axis) while changing the second predetermined frequency, and determines a point corresponding to a convergence value on which distribution of the plurality of intersections converges to be a correction reference point (step S201). The "second predetermined frequency" is set in advance to determine the correction reference point, and is appropriately selected from a frequency range of the AC voltage that is applied to the battery 10 to obtain the complex impedance. A plurality of second predetermined frequencies may be set to calculate a plurality of straight lines. The second predetermined frequency may include the first predetermined frequency.

On the other hand, one second predetermined frequency may be set to calculate one intersection. In this case, the calculated intersection may be determined to be the correction reference point. In this manner, the correction reference point can be determined more easily than when the plurality of intersections are calculated. From the viewpoint of more appropriately determining the correction reference point, as explained above, it is preferable to determine the point corresponding to the convergence value of the plurality of intersections to be the correction reference point.

Figure 9:
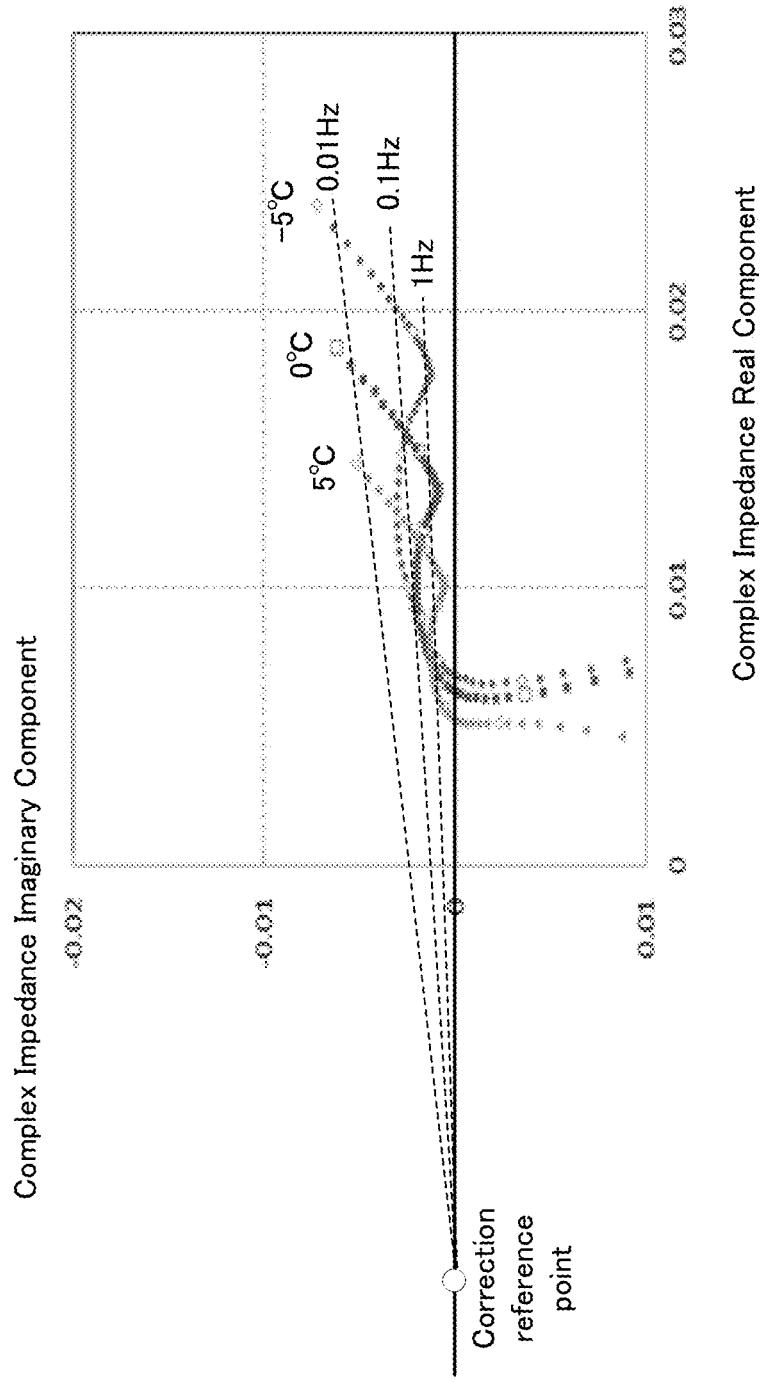
FIG. 9 is a graph illustrating intersections of straight lines, each of which indicates a slope of the complex impedance, and an X axis.
Figure 10:
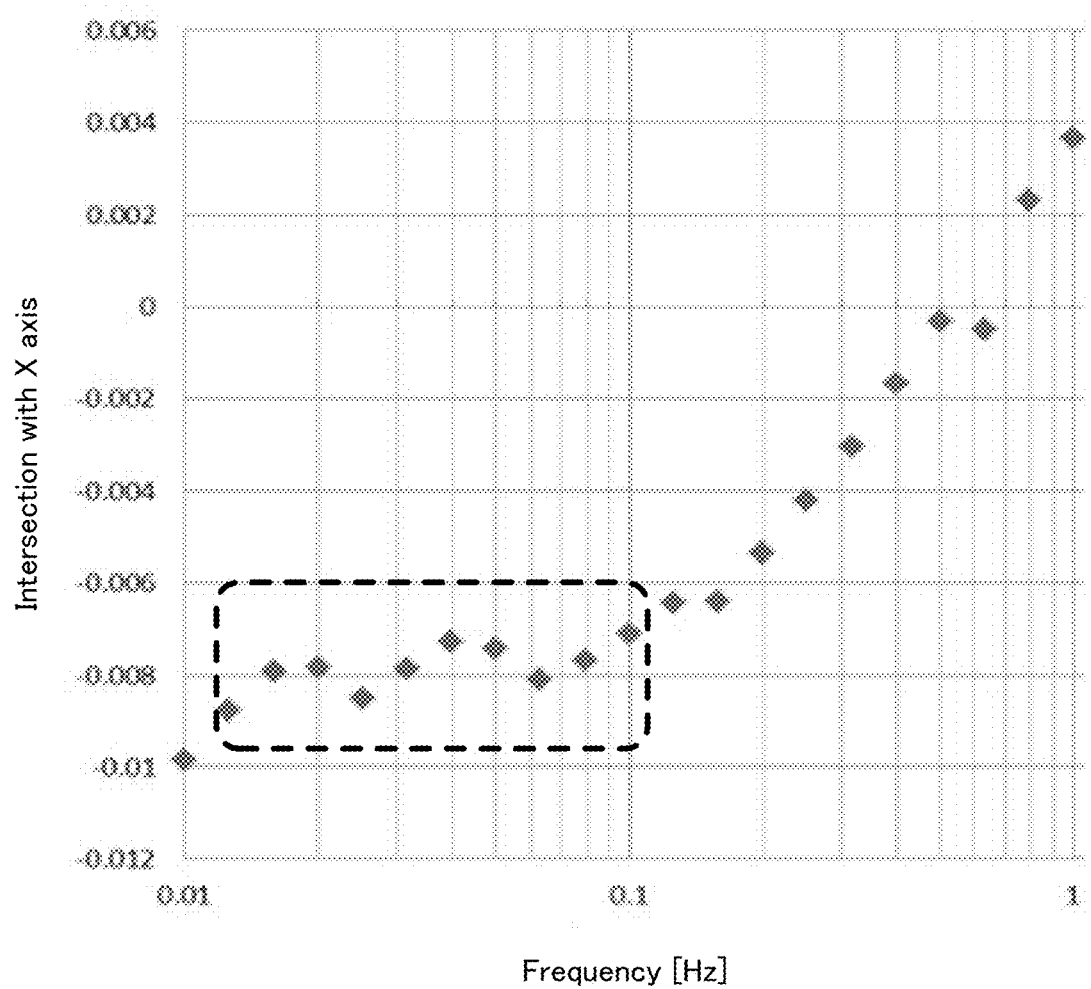
FIG. 10 is a graph illustrating that distribution of intersections of the straight lines indicating the slope of the complex impedance and the X axis converges in a particular frequency band.

Hereinafter, the method of determining the correction reference point from the plurality of intersections will be explained in detail with reference to FIG. 9 and FIG. 10. FIG. 9 is a graph illustrating the intersections of straight lines, each of which indicates the slope of the complex impedance, and the X axis. FIG. 10 is a graph illustrating that the distribution of the intersections of the straight lines indicating the slope of the complex impedance and the X axis converges in a particular frequency band.

As illustrated in FIG. 9, the correction reference point determinator 150 is configured to calculate the straight line connecting the values of the plurality of complex impedances corresponding to the second predetermined frequency, and is configured to calculate the intersection of the straight line and the X axis on a complex plane. In the example illustrated in FIG. 9, the second predetermined frequency is changed to three frequencies, which are 0.01 Hz, 0.1 Hz, and 1Hz, and three straight lines and three intersections of the three straight lines and the X axis are calculated. According to the studies by the present inventors, it has been found that the intersections of the plurality of straight lines and the X axis converge on one point in a particular frequency range.

As illustrated in FIG. 10, the plurality of intersections converge on an extremely narrow area in a range of the second predetermined frequency of 0.01 Hz to 0.1 Hz. The correction reference point determinator 150 is configured to determine a point on which the plurality of intersections converge in this manner to be the correction reference point. For example, the correction reference point determinator 150 may determine a value obtained by averaging positions of the intersections that converge (i.e. intersections surrounded by a dashed line) to be a position of the correction reference point.

After the determination of the correction reference point, the slope corrector 160 corrects the slope of the complex impedance calculated by the slope calculator 120, on the basis of the correction reference point (step S202). More specifically, the slope corrector 160 sets a slope of a straight line (which is specifically an approximate straight line) connecting the correction reference point and any values of the plurality of complex impedances corresponding to the first predetermined frequency, as the slope of the complex impedance. In other words, the slope of the complex impedance is corrected as the slope of the straight line passing through the correction reference point.

Figure 11:
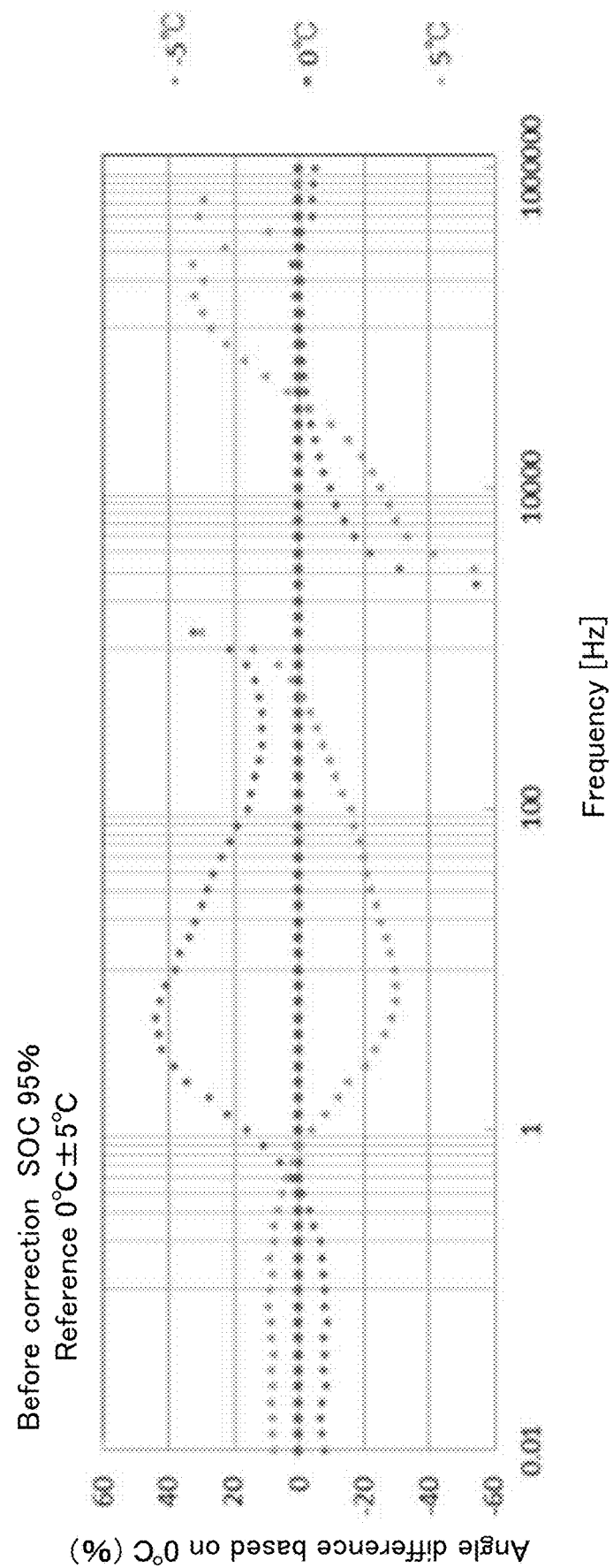
FIG. 11 is a diagram illustrating frequency characteristics of the slope of the complex impedance from an origin.
Figure 12:
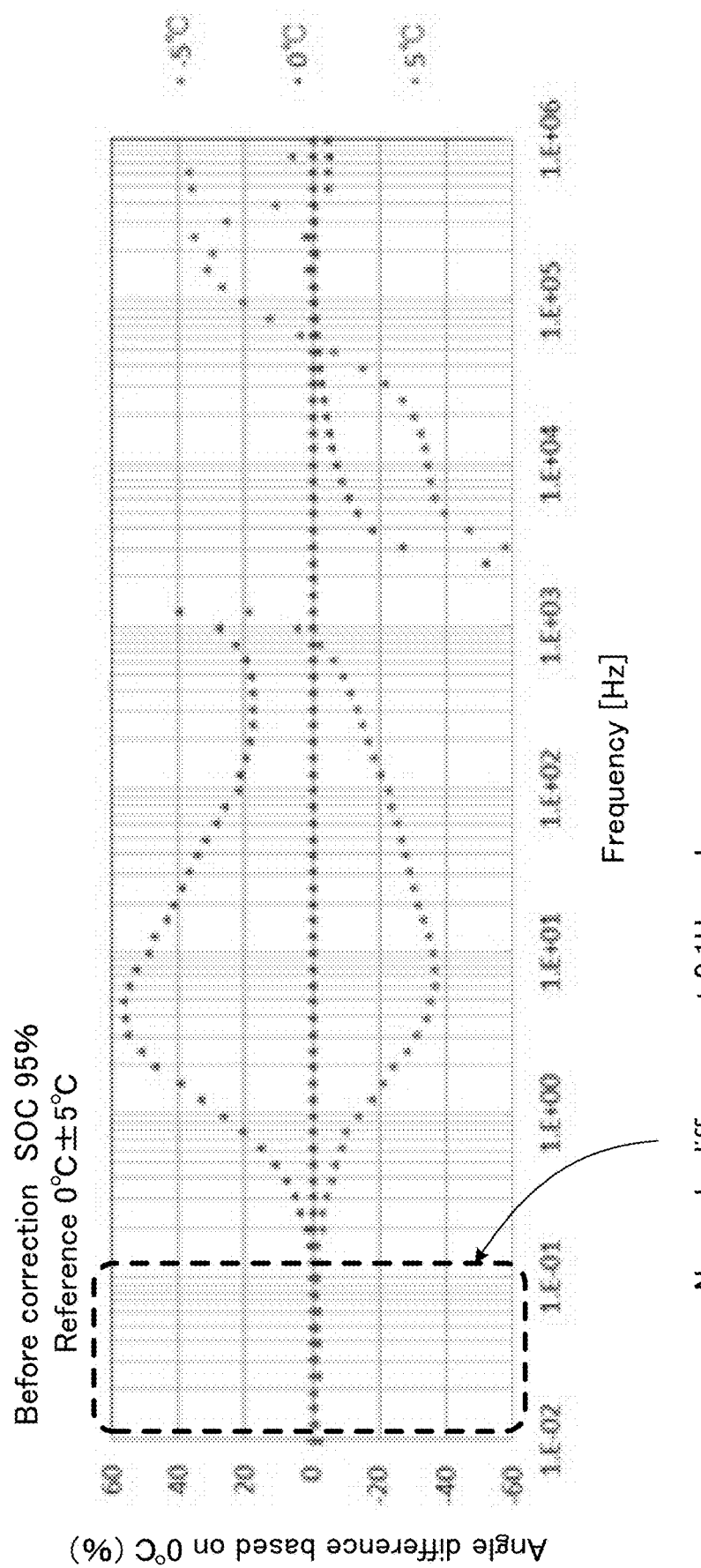
FIG. 12 is a diagram illustrating frequency characteristics of the slope of the complex impedance from a correction reference point.
Figure 13:
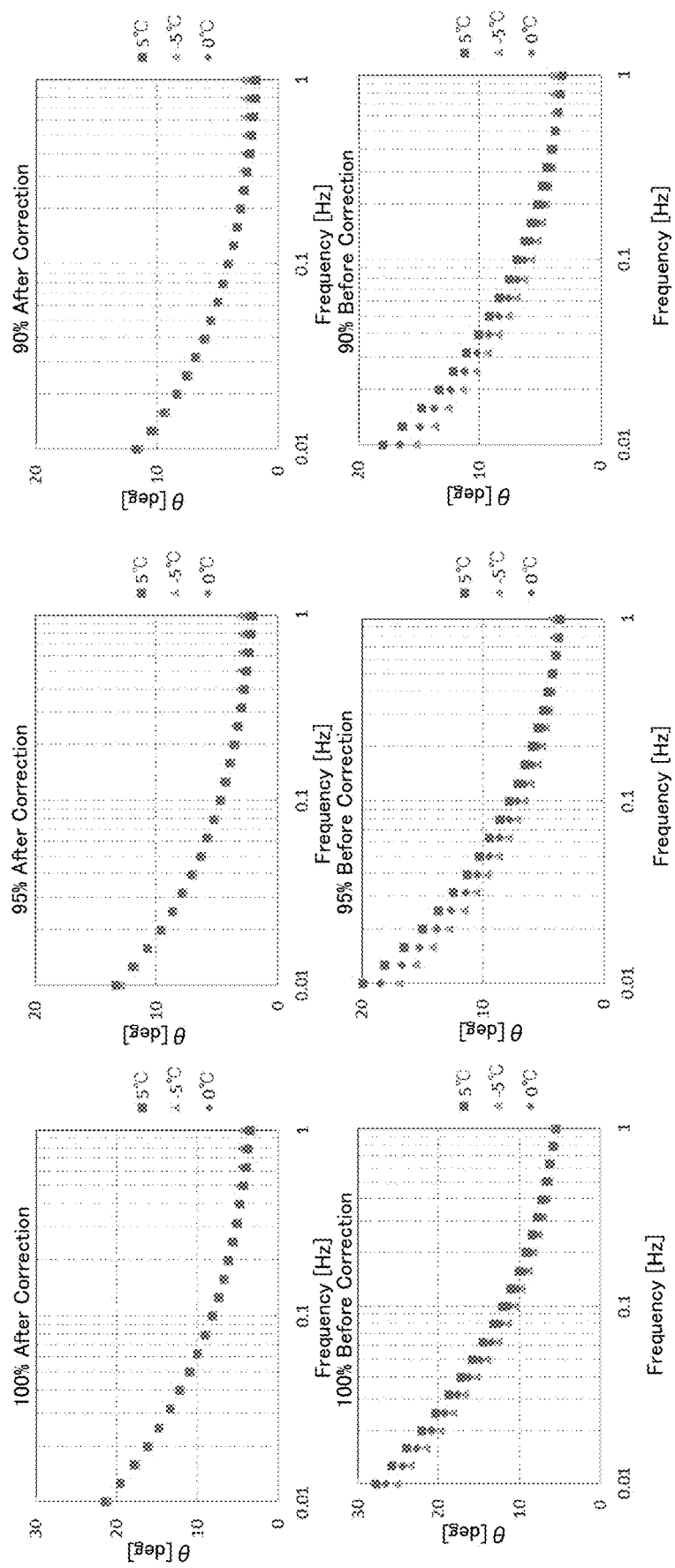
FIG. 13 is diagrams illustrating frequency characteristics of the slope of the complex impedance after and before correction for each SOC.

Next, technical effect obtained by the correction using the correction reference point will be explained in detail with reference to FIG. 11 to FIG. 13. FIG. 11 is a diagram illustrating frequency characteristics of the slope of the complex impedance from an origin. FIG. 12 is a diagram illustrating frequency characteristics of the slope of the complex impedance from the correction reference point. FIG. 13 is diagrams illustrating frequency characteristics of the slope of the complex impedance after and before correction for each SOC.

As illustrated in FIG. 11, the slope of the complex impedance from the origin has such frequency characteristics that there is an angle difference (or slope difference) to some extent in any case of 5 degrees C. and −5 degrees C. based on 0 degrees C. This indicates that the influence of the temperature dependence cannot be eliminated by simply calculating the slope of the complex impedance from the origin.

In contrast, as illustrated in FIG. 12, the slope of the complex impedance from the correction reference point has such frequency characteristics that there is no angle difference based on 0 degrees C. in a range of 0.01 Hz to 0.1 Hz (or a range surrounded by a dashed line in the drawing). This indicates that the influence of the temperature dependence can be almost completely eliminated in the range of 0.01 Hz to 0.1 Hz, by using the straight line passing through the correction reference point to correct the slope of the complex impedance. This effect is higher than that when the complex impedance is calculated from the straight line connecting the values corresponding to the first predetermined frequency.

As illustrated in FIG. 13, it is clear that the variation in angle before the correction due to the temperature difference is eliminated after the correction, even when the SOC is changed to 100%, 95%, and 90%. As described above, the influence of the temperature dependence can be more preferably eliminated by using the correction reference point to correct the slope of the complex impedance.

Back in FIG. 8, after the correction of the slope of the complex impedance, the battery state estimator 140 reads the relation between the slope of the complex impedance and the SOC, which is stored in advance, from the storage 130 (the step S103), and estimates the current SOC of the battery 10 from the corrected slope of the complex impedance (the step S104). The battery state estimator 140 then outputs the estimated value of the SOC of the battery 10 (the step S105).

As explained above, according to the battery state estimating apparatus 200 in the second embodiment, it is possible to more certainly eliminate the influence of the temperature dependence and to estimate the SOC of the battery 10, by using the correction reference point to correct the slope of the complex impedance.

(3) First Modified Example

Figure 14:
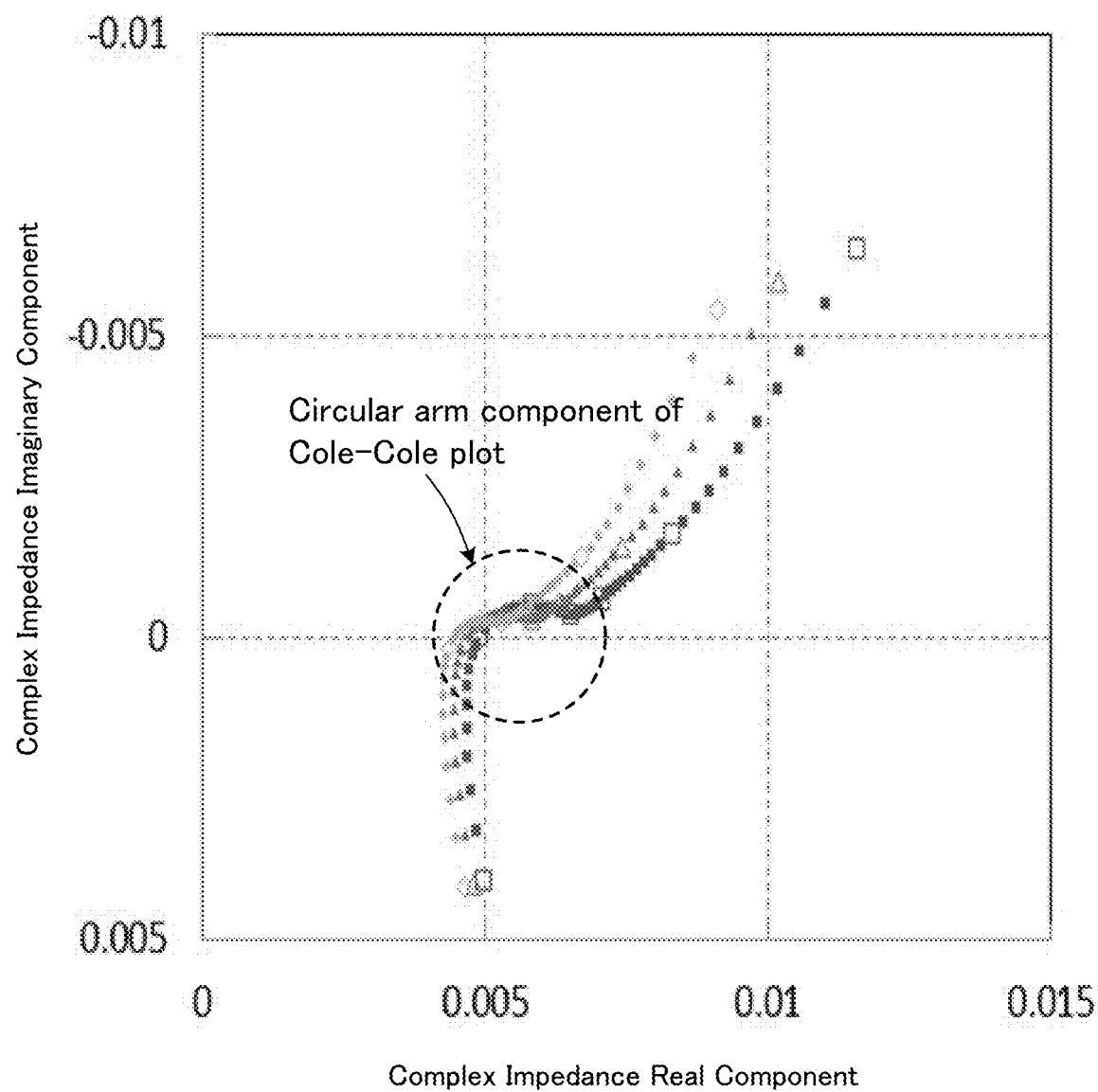
FIG. 14 is a graph illustrating a circular arc component of the complex impedance.
Figure 15:
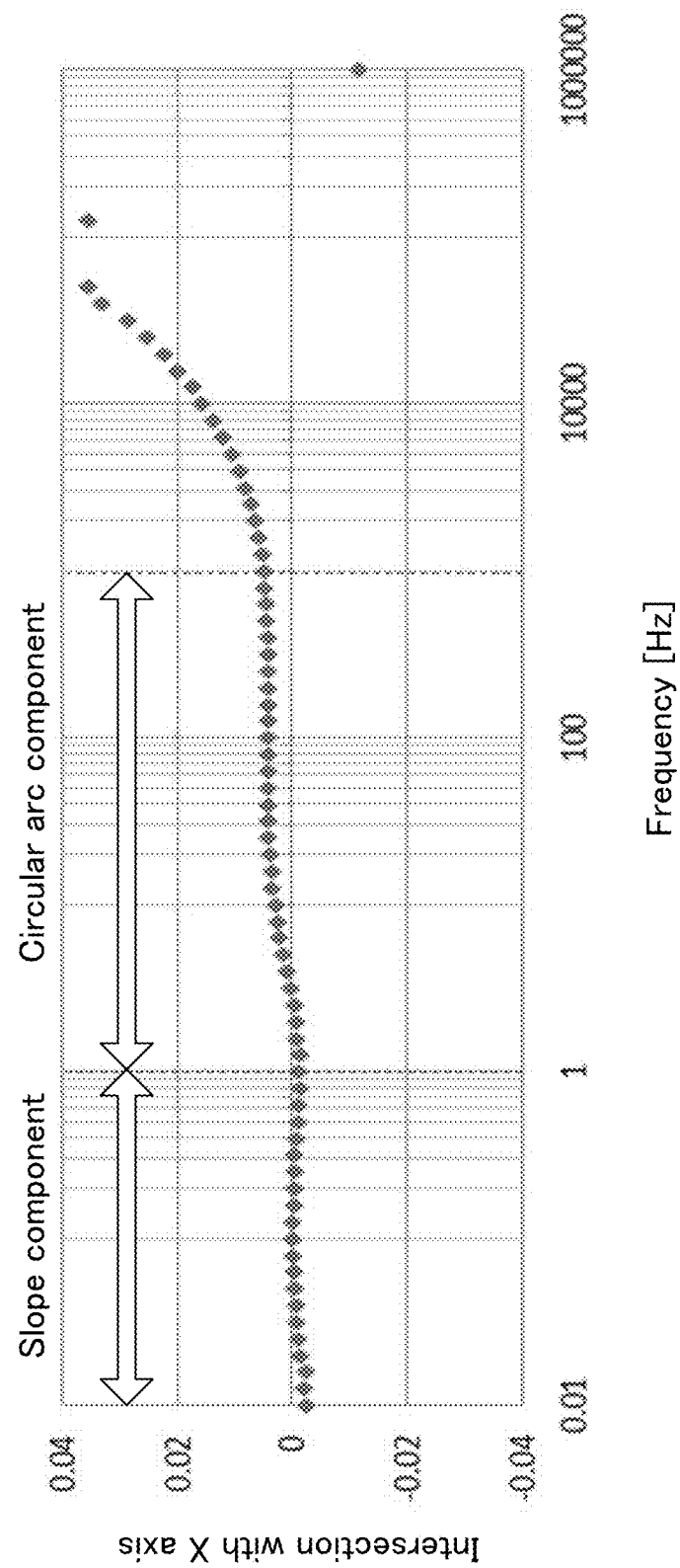
FIG. 15 is a graph illustrating that distribution of the intersections of the straight lines indicating the slope of the complex impedance and the X axis converges even in a frequency corresponding to the circular arc component.

Next, a first modified example using a circular arc component of the complex impedance will be explained with reference to FIG. 14 and FIG. 15. FIG. 14 is a graph illustrating the circular arc component of the complex impedance. FIG. 15 is a graph illustrating that the distribution of the intersections of the straight lines indicating the slope of the complex impedance and the X axis converges even in a frequency corresponding to the circular arc component. FIG. 14 illustrates data measured under conditions of 20 degree C., 25 degree C., and 30 degree C.

As illustrated in FIG. 14, the second predetermined frequency in the calculation of the correction reference point can also use a frequency corresponding to the circular arc component of a Cole-Cole plot. In other words, it is possible to use a component other than a substantially linear component (i.e. a slope component) as in FIG. 9 or the like.

As illustrated in FIG. 15, even when the second predetermined frequency is set at the frequency corresponding to the circular arc component (which is herein 1 Hz to 1000 Hz), the intersections with the X axis also converge as in the slope component. It is thus possible to determine the correction reference point even in using the circular arc component, and it is possible to more certainly eliminate the influence of the temperature dependence.

(4) Second Modified Example

Figure 16:
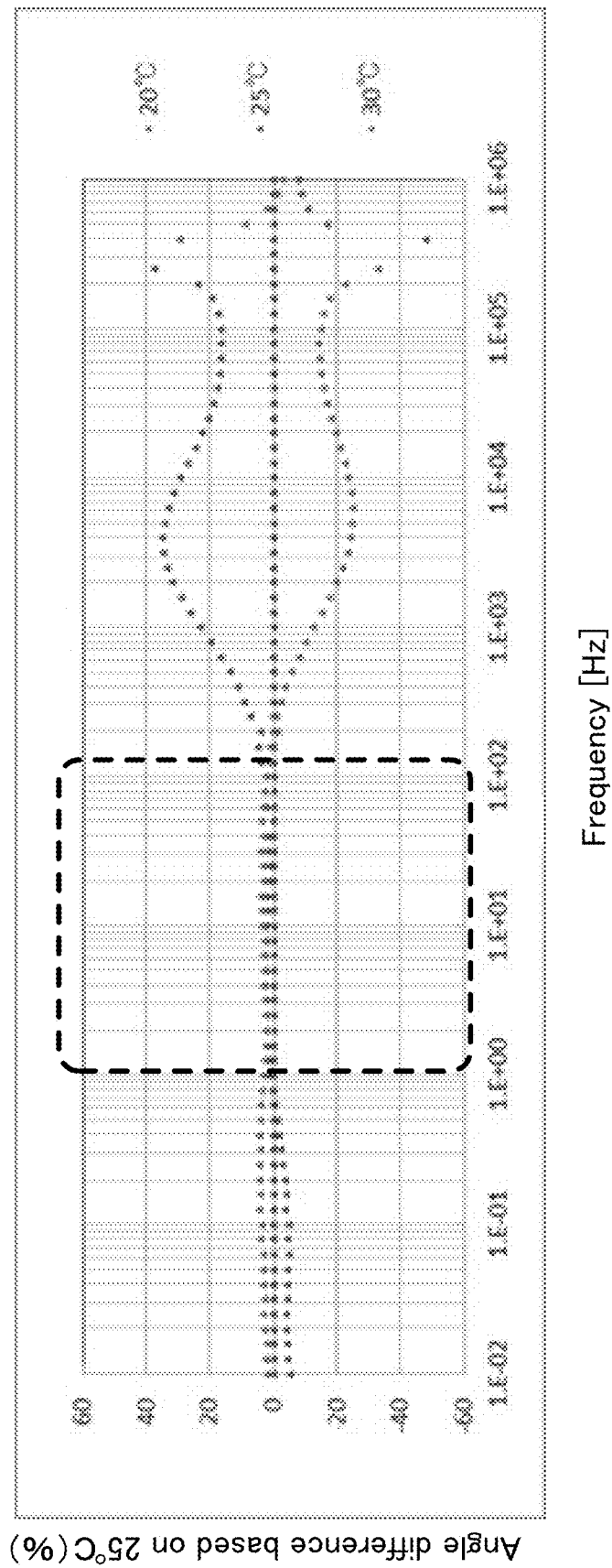
FIG. 16 is version 1 of a diagram illustrating frequency characteristics of the slope of the complex impedance in an all-solid battery.
Figure 17:
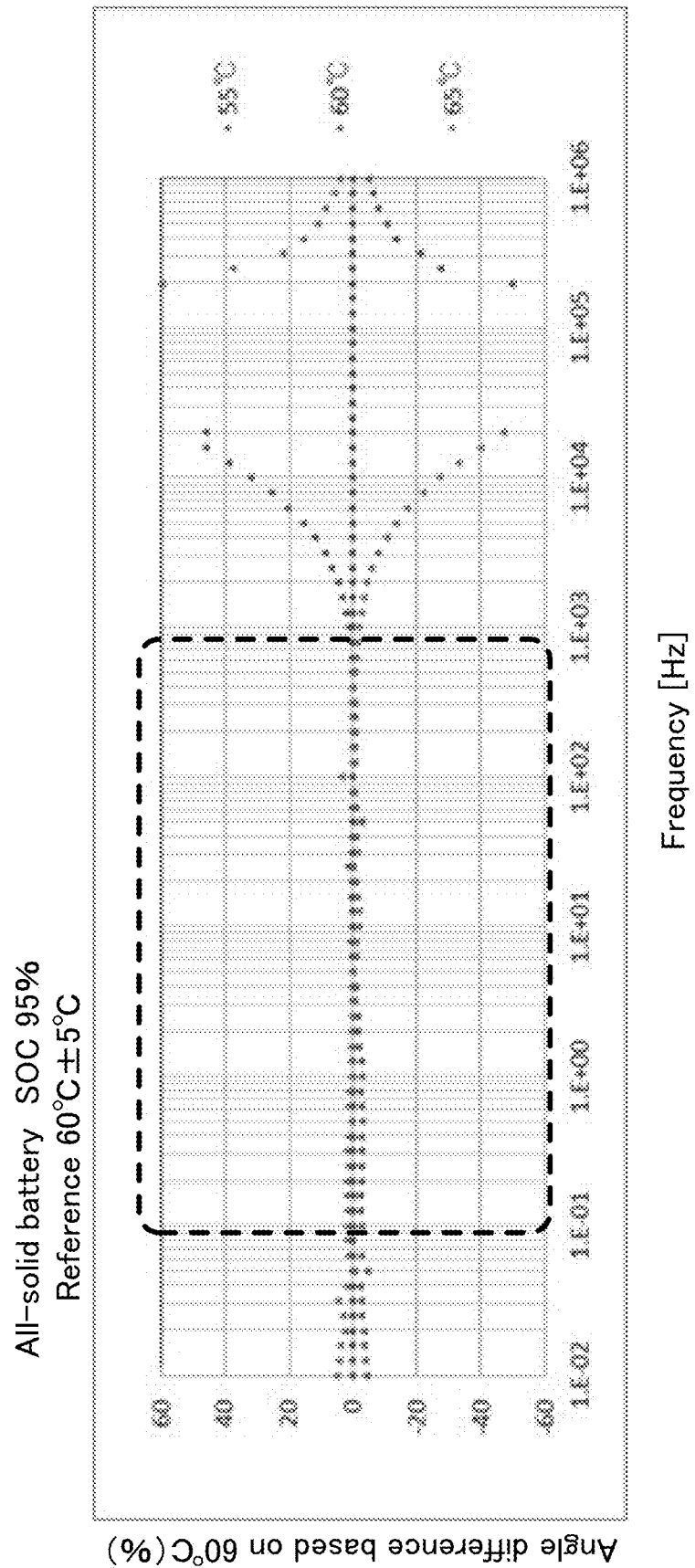
FIG. 17 is version 2 of a diagram illustrating the frequency characteristics of the slope of the complex impedance in the all-solid battery.

Next, a second modified example applied to an all-solid battery will be explained with reference to FIG. 16 and FIG. 17. FIG. 16 is version 1 of a diagram illustrating frequency characteristics of the slope of the complex impedance in the all-solid battery. FIG. 17 is version 2 of a diagram illustrating the frequency characteristics of the slope of the complex impedance in the all-solid battery.

As illustrated in FIG. 16 and FIG. 17, even when the battery 10 is the all-solid battery, the angle variation due to the temperature difference can be extremely reduced by using the correction reference point to correct the slope of the complex impedance (refer to areas surrounded by dashed lines in the drawings). It is therefore possible to estimate the SOC of the battery 10 in the same method, even when the battery 10 is not an aqueous battery, such as a lithium ion battery.

Third Embodiment

A battery state estimating apparatus 300 according to a third embodiment will be explained. The third embodiment is partially different from the first embodiment in configuration and operation, and the other part is substantially the same. Thus, hereinafter, a different part from that of the first embodiment explained above will be explained in detail, and an explanation of the same part will be omitted.

(1) Configuration of Apparatus

Figure 18:
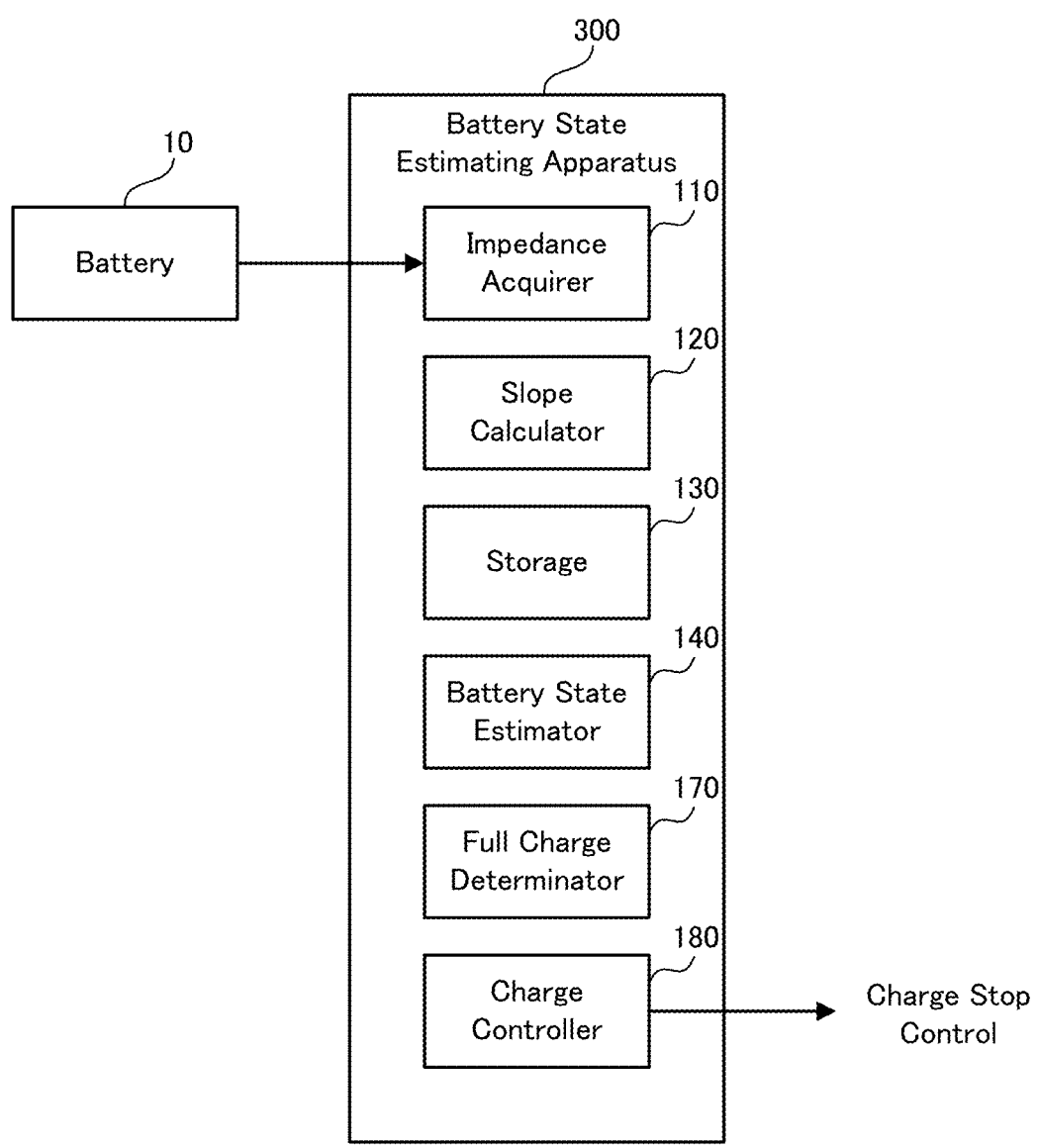
FIG. 18 is a block diagram illustrating a configuration of a battery state estimating apparatus according to a third embodiment.

Firstly, a configuration of the battery state estimating apparatus 300 according to the third embodiment will be explained with reference to FIG. 18. FIG. 18 is a block diagram illustrating the configuration of the battery state estimating apparatus 300 according to the third embodiment. FIG. 18 carries the same reference numerals as those for the same constituent elements illustrated in FIG. 1.

As illustrated in FIG. 18, the battery state estimating apparatus 300 according to the third embodiment is provided with a full charge determinator 170 and a charge controller 180, in addition to the constituent elements of the battery state estimating apparatus 100 according to the first embodiment (refer to FIG. 1). Moreover, the battery 10 according to the third embodiment is configured to be charged by charge control, which is performed by a not-illustrated charger. One example of the charger is, for example, a motor generator with a regenerative function, or the like.

The full charge determinator 170 is configured to determine whether or not the battery 10 is fully charged from the value of the SOC of the battery 10 estimated by the battery state estimator 140. The expression "fully charged or full charge" may include not only a state in which the battery 10 has a SOC of 100%, but also a state in which it can be determined that the battery 10 is not to be charged anymore.

Specifically, the full charge determinator 170 may determine a state in which the SOC of the battery 10 reaches an upper limit value, which is set to suppress degradation of the battery 10, to be "full charge". A determination result of the full charge determinator 170 is configured to be outputted to the charge controller 180.

The charge controller 180 is configured to control the charge of the battery 10 performed by the charger. In particular, the charge controller 180 according to the embodiment is configured to stop the charge of the battery 10 depending on the determination result of the full charge determinator 170. In other words, the charge controller 180 functions as one specific example of the "stopper".

(2) Explanation of Operation

Figure 19:
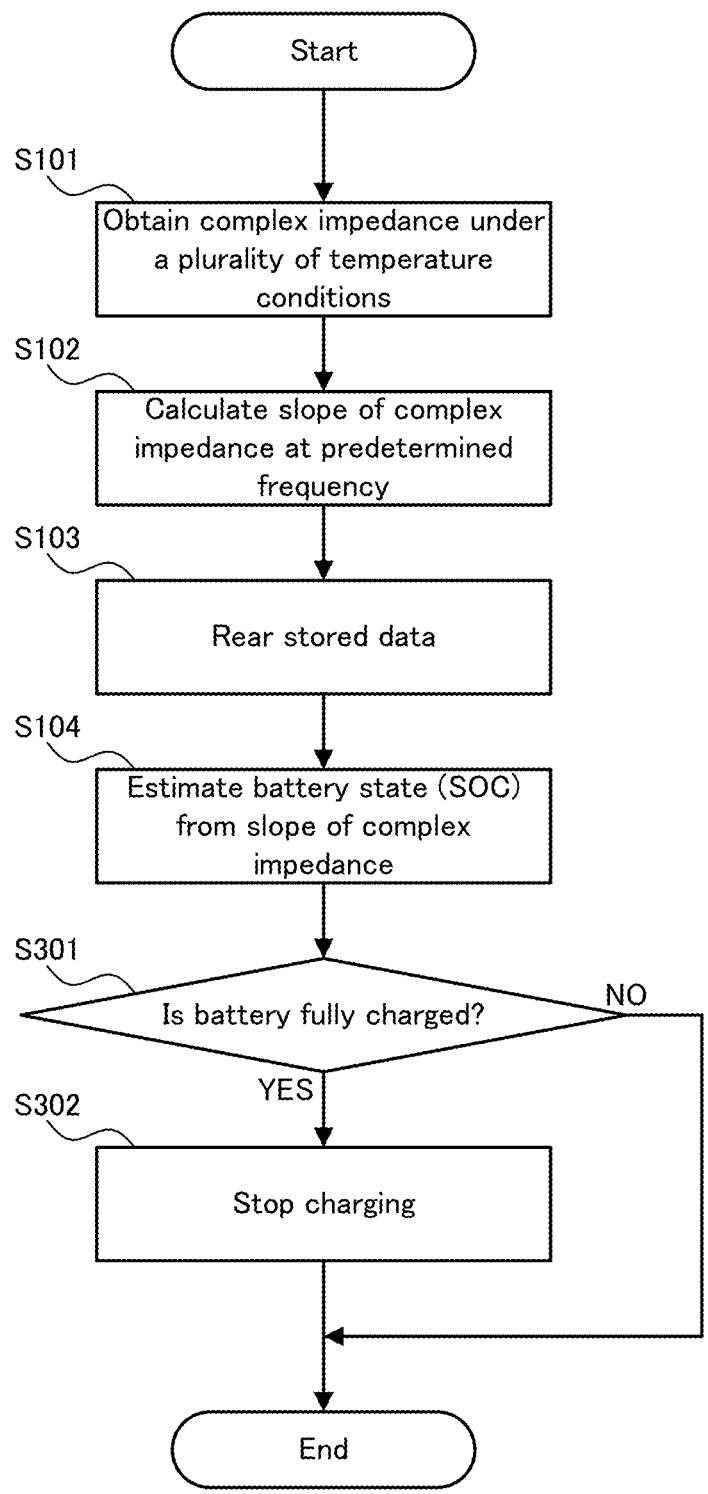
FIG. 19 is a flowchart illustrating a flow of operation of the battery state estimating apparatus according to the third embodiment.

Next, operation of the battery state estimating apparatus 300 according to the third embodiment will be explained with reference to FIG. 19. FIG. 19 is a flowchart illustrating a flow of the operation of the battery state estimating apparatus 300 according to the third embodiment. FIG. 19 carries the same reference numerals as those for the same steps illustrated in FIG. 2. The following process is assumed to be started in a state in which the charge of the battery 10 is performed.

As illustrated in FIG. 19, in operation of the battery state estimating apparatus 300 according to the third embodiment, the impedance acquirer 110 firstly obtains the complex impedance of the battery 10 under the plurality of different temperature conditions (the step S101), and the slope calculator 120 calculates the slope of the complex impedance from the obtained plurality of complex impedances (the step S102). The battery state estimator 140 then reads the relation between the slope of the complex impedance and the SOC, which is stored in advance, from the storage 130 (the step S103), and estimates the current SOC of the battery 10 from the corrected slope of the complex impedance (the step S104). In other words, so far, the same process as in the first embodiment is performed.

Particularly in the third embodiment, after the estimation of the SOC of the battery 10 by the battery state estimator 140, the full charge determinator 170 determines whether or not the battery 10 is fully charged (step S301). In other words, the full charge determinator 170 may determine whether or not the SOC of the battery 10 estimated by the battery state estimator 140 has a value corresponding to the full charge.

If it is determined that the battery 10 is fully charged (the step S301: YES), the charge controller 180 stops the charge control of the batter 10 (step S302). On the other hand, if it is determined that the battery 10 is not fully charged (the step S301: NO), the charge controller 180 does not stop the charge control of the batter 10 (i.e. the charge control of the batter 10 is continued).

As explained above, according to the battery state estimating apparatus 300 in the third embodiment, it is possible to suppress overcharge of the battery 10, by using the SOC of the battery 10 estimated from the slope of the complex impedance.

Fourth Embodiment

A battery state estimating apparatus according to a fourth embodiment will be explained. The fourth embodiment is different from the first and second embodiments in that a state of health (SOH) is estimated as the battery state of the battery 10, and the fourth embodiment is the same as the first and second embodiments in that the slope of the complex impedance is used. Thus, hereinafter, a different part from those of the first and second embodiments explained above will be explained in detail, and an explanation of the same part will be omitted.

(1) Change in Complex Impedance due to Battery Degradation

Figure 20:
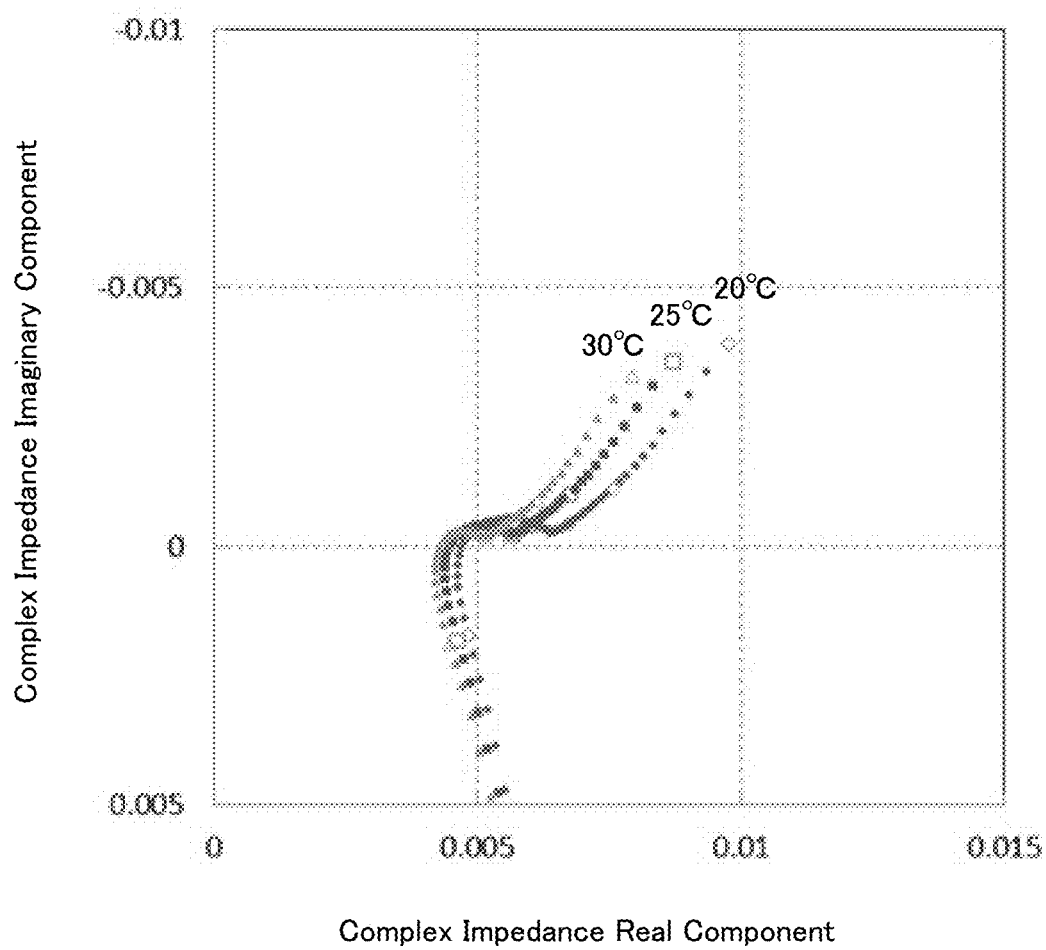
FIG. 20 is a graph illustrating the complex impedance of a new battery.
Figure 21:
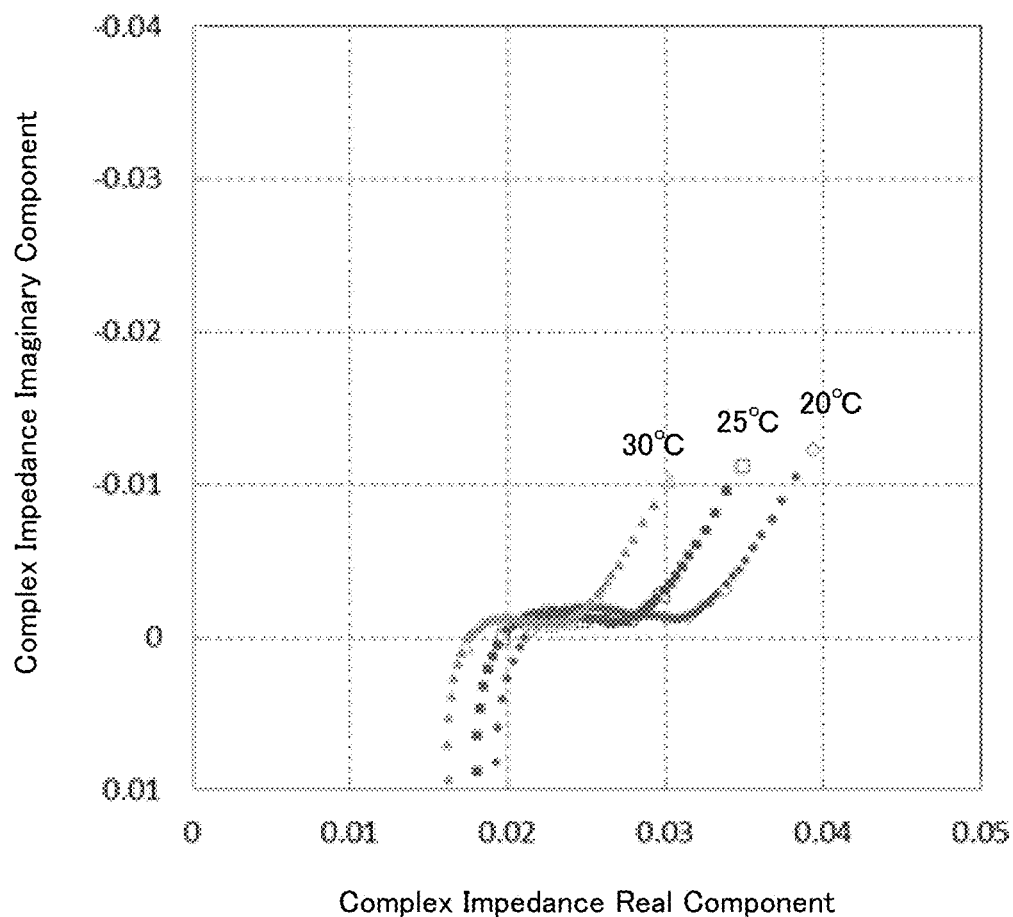
FIG. 21 is a graph illustrating the complex impedance of a degraded battery.

A change in complex impedance due to degradation of the battery 10 will be specifically explained with reference to FIG. 20 and FIG. 21. FIG. 20 is a graph illustrating the complex impedance of a new battery. FIG. 21 is a graph illustrating the complex impedance of a degraded battery.

As is clear from comparison between FIG. 20 and FIG. 21, a new battery 10 (which is namely not degraded and has a high SOH) and a degraded battery 10 (which has a low SOH due to degradation) have different values of the complex impedance, even though the complex impedance is obtained under the same temperature condition. In other words, due to the degradation of the battery 10, the complex impedance obtained from the battery 10 also changes.

(2) Method of Estimating SOH

Figure 22:
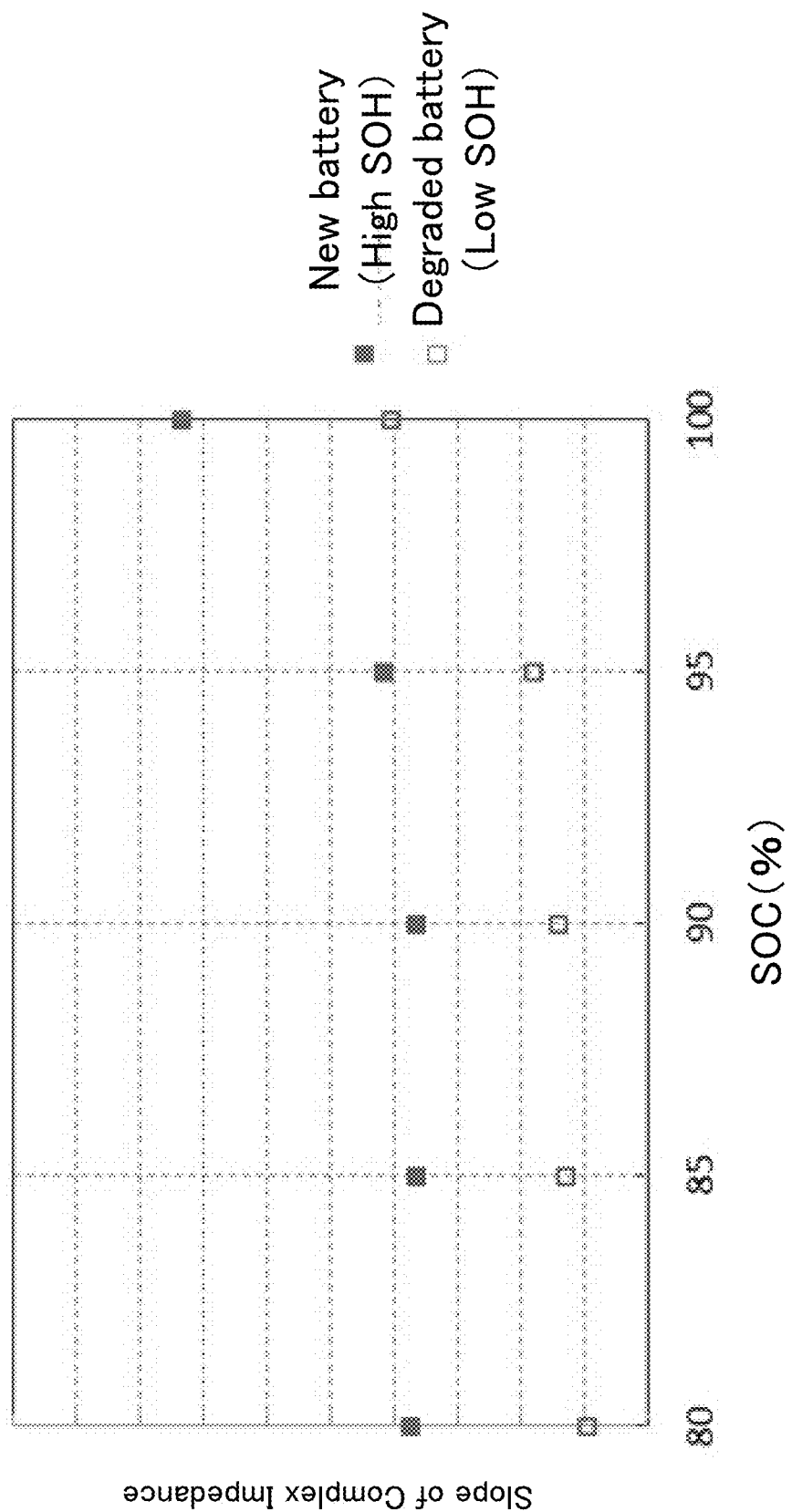
FIG. 22 is a map illustrating a relation between the slope of the complex impedance and SOC in the new battery and the degraded battery.

Next, a method of estimating the SOH from the slope of the complex impedance will be explained in detail with reference to FIG. 22. FIG. 22 is a map illustrating a relation between the slope of the complex impedance and the SOC in the new battery and the degraded battery.

As illustrated in FIG. 22, according to the studies by the present inventors, it has been found that the relation between the SOC of the battery 10 and the slope of the complex impedance varies depending on whether the battery 10 is new or degraded. This is caused by the change in the complex impedance obtained from the battery 10 depending on the SOH of the battery 10, as illustrated in FIG. 20 and FIG. 21.

The new battery 10 and the degraded battery 10 have different values of the slope of the complex impedance corresponding to each SOC, and also have different variation tendencies. Specifically, when the SOC changes from 80% to 90%, the slope of the complex impedance decreases with increasing SOC in the new battery 10; however, the slope of the complex impedance increases with increasing SOC in the degraded battery 10. The SOH of the battery 10 can be thus estimated by focusing on the variation tendency of the slope of the complex impedance when the SOC increases or decreases.

As explained above, according to the battery state estimating apparatus in the fourth embodiment, the SOH can be estimated as the battery state of the battery 10. In a relation between the SOH of the battery 10 and the slope of the complex impedance, the influence of the temperature dependence is eliminated. It is thus possible to accurately estimate the SOH of the battery 10 without considering the temperature of the battery 10, by using the slope of the complex impedance.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A battery state estimating apparatus comprising:
a storage configured to store in advance a relation between (i) a slope of a complex impedance of a plurality of complex impedances, and (ii) a battery state associated with a battery; and
one or more processors operatively coupled to the storage, the one or more processors being programmed to act as:
an acquirer configured to obtain the plurality of complex impedances of the battery at a plurality of different temperatures;
a calculator configured to calculate the slope of a straight line connecting values of the obtained plurality of complex impedances at a first predetermined frequency on a complex plane having an axis that is a real component of each complex impedance and an axis that is an imaginary component of each complex impedance, as a slope of each complex impedance; and
an estimator configured to estimate the battery state based on (i) the calculated slope of the plurality of complex impedances, and (ii) the stored relation.

2. The battery state estimating apparatus according to claim 1, wherein the one or more processors is configured to further act as:
a determinator configured to determine an intersection of a straight line connecting values of the obtained plurality of complex impedances at a second predetermined frequency and the axis that is the real component, to be a reference point; and
a corrector configured to correct the calculated slope of the plurality of complex impedances to a slope of a straight line connecting the reference point and the values of the obtained plurality of complex impedances at the first predetermined frequency.

3. The battery state estimating apparatus according to claim 2, wherein the determinator is configured to calculate a plurality of intersections by changing the second predetermined frequency and is configured to determine a point corresponding to a convergence value on which a distribution of the calculated plurality of intersections converges, to be the reference point.

4. The battery state estimating apparatus according to claim 3, wherein the second predetermined frequency is a frequency corresponding to a circular arc component of each complex impedance on the complex plane.

5. The battery state estimating apparatus according to claim 2, wherein the second predetermined frequency is a frequency corresponding to a circular arc component of each complex impedance on the complex plane.

6. The battery state estimating apparatus according to claim 1, wherein the battery state includes a value indicating a charge amount of the battery.

7. The battery state estimating apparatus according to claim 6, further comprising:
a charger configured to charge the battery; and
a stopper configured to stop charging performed by the charger when the value indicating a charge amount of the battery is a value corresponding to full charge.

8. The battery state estimating apparatus according to claim 1, wherein the battery state includes a value indicating degree of degradation of the battery.

9. The battery state estimating apparatus according to claim 1, wherein acquirer obtains the plurality of complex impedances at each of a plurality of different internal temperatures of the battery, and each complex impedance is plotted as different lines with decreasing temperature onto a single graph for calculating the slope of the line to connect the plurality of complex impedances.

* * * * *